(12) United States Patent
Hsieh

(10) Patent No.: US 12,476,177 B2
(45) Date of Patent: Nov. 18, 2025

(54) SEMICONDUCTOR PACKAGE STRUCTURE

(71) Applicant: Advanced Semiconductor Engineering, Inc., Kaohsiung (TW)

(72) Inventor: Meng-Wei Hsieh, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 618 days.

(21) Appl. No.: 17/744,460

(22) Filed: May 13, 2022

(65) Prior Publication Data

US 2023/0369188 A1 Nov. 16, 2023

(51) Int. Cl.
| | |
|---|---|
| *H01L 23/498* | (2006.01) |
| *H01L 23/00* | (2006.01) |
| *H01L 23/31* | (2006.01) |
| *H01L 25/065* | (2023.01) |

(52) U.S. Cl.
CPC .... *H01L 23/49822* (2013.01); *H01L 23/3107* (2013.01); *H01L 23/49827* (2013.01); *H01L 23/49894* (2013.01); *H01L 23/562* (2013.01); *H01L 25/0655* (2013.01)

(58) Field of Classification Search
CPC . H01L 23/49822; H01L 23/315; H01L 24/97; H01L 2224/97; H01L 2225/1041; H01L 2225/107; H01L 25/0655; H01L 23/5389
See application file for complete search history.

(56) References Cited

U.S. PATENT DOCUMENTS

| | | | |
|---|---|---|---|
| 10,872,852 B2 | 12/2020 | Shih | |
| 2017/0236809 A1* | 8/2017 | Trimberger | H01L 23/5385 257/777 |
| 2020/0273839 A1* | 8/2020 | Elsherbini | H01L 24/13 |
| 2023/0290701 A1* | 9/2023 | Im | H01L 23/49822 |

* cited by examiner

*Primary Examiner* — Moazzam Hossain
(74) *Attorney, Agent, or Firm* — FOLEY & LARDNER LLP

(57) ABSTRACT

A semiconductor package structure is provided. The semiconductor package structure includes a substrate, a first electronic component, and an electronic device. The first electronic component is disposed over the substrate. The electronic device is at least partially embedded in the substrate. The electronic device includes a second electronic component and a reinforcement. The second electronic component is configured for providing a regulated voltage to the first electronic component. The reinforcement supports the second electronic component.

20 Claims, 21 Drawing Sheets

SEMICONDUCTOR PACKAGE STRUCTURE

BACKGROUND

1. Technical Field

The present disclosure relates generally to a semiconductor package structure.

2. Description of the Related Art

Currently, interposers have been widely used for electrical interconnection between a substrate and various functional chips. However, as the number of functional chips increases within a package, conduction paths between the substrate and various functional chips are undesirably increased. As a result, transmission loss is increased, and electrical performance is adversely affected.

SUMMARY

In one or more embodiments, a semiconductor package structure includes a substrate, a first electronic component, and an electronic device. The first electronic component is disposed over the substrate. The electronic device is at least partially embedded in the substrate. The electronic device includes a second electronic component and a reinforcement. The second electronic component is configured for providing a regulated voltage to the first electronic component. The reinforcement supports the second electronic component.

In one or more embodiments, a semiconductor package structure includes an interposer, a first electronic component, and a first conductive structure. The interposer has a cavity. The first electronic component is disposed in the cavity. The first conductive structure extends along a lateral surface of the first electronic component and configured for providing heat dissipation for a second electronic component outside of the interposer.

In one or more embodiments, a semiconductor package structure includes a semiconductor interposer, a first electronic component, a second electronic component, and a first connection structure. The semiconductor interposer has an upper surface. The first electronic component is at least partially embedded in the semiconductor interposer. The second electronic component is disposed over the upper surface of the semiconductor interposer. The second electronic component being over the first electronic component. The first connection structure is configured to provide a first electrical path from the first electronic component to the second electronic component vertically.

BRIEF DESCRIPTION OF THE DRAWINGS

Aspects of the present disclosure are best understood from the following detailed description when read with the accompanying drawings. It is noted that various features may not be drawn to scale, and the dimensions of the various features may be arbitrarily increased or reduced for clarity of discussion.

Common reference numerals are used throughout the drawings and the detailed description to indicate the same or similar elements. The present disclosure will be more apparent from the following detailed description taken in conjunction with the accompanying drawings.

DETAILED DESCRIPTION

Figure 1A:
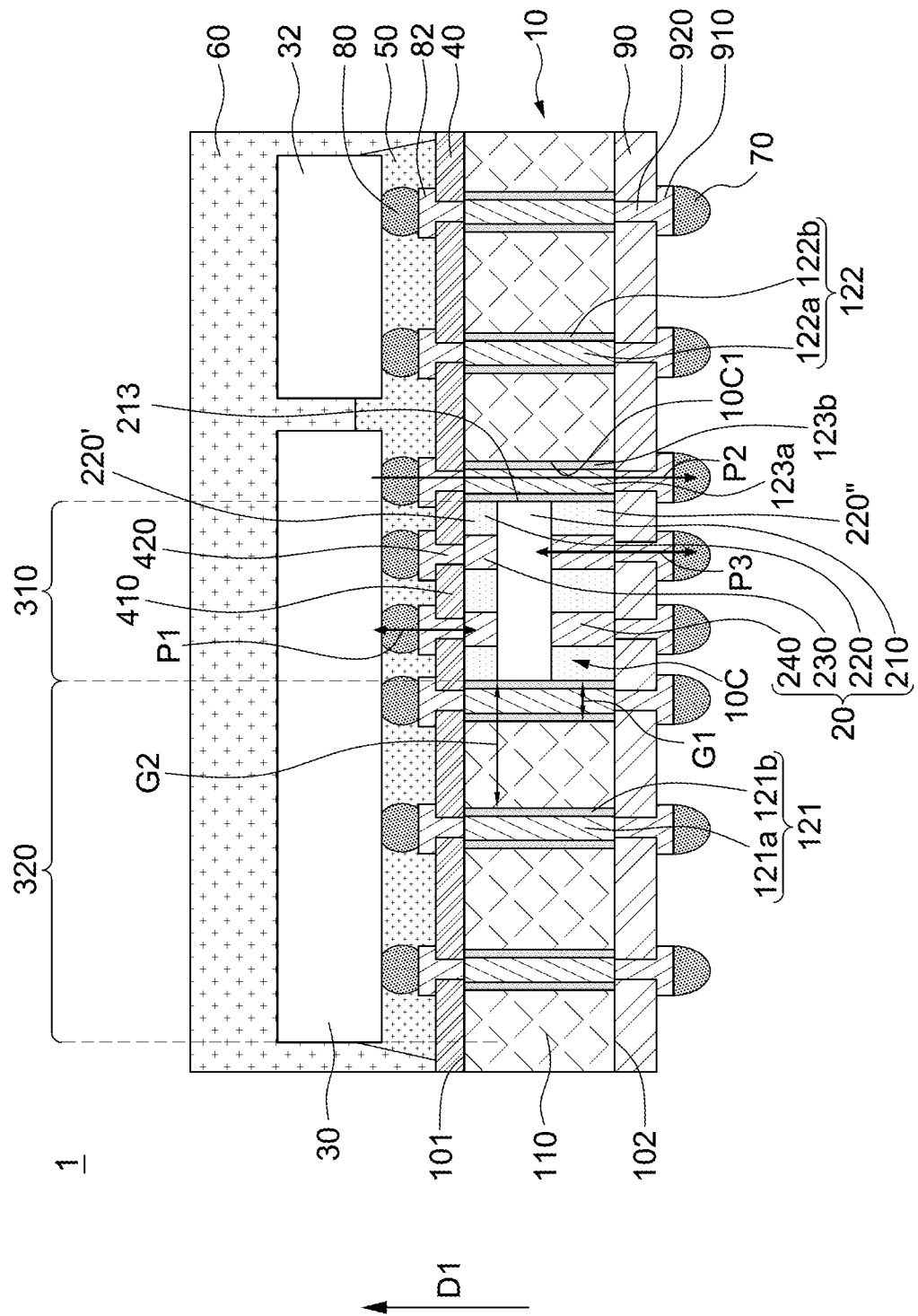
FIG. 1A illustrates a cross-sectional view of a semiconductor package structure in accordance with some embodiments of the present disclosure.

FIG. 1A illustrates a cross-sectional view of a semiconductor package structure 1 in accordance with some embodiments of the present disclosure. The semiconductor package structure 1 includes a substrate 10, an electronic device 20, electronic components 30 and 32, a redistribution layer (RDL) 40, an underfill 50, an encapsulant 60, electrical contacts 70, connection elements 80 and 82, an insulation layer 90, conductive structures 123a, and insulting layers 123b.

The substrate 10 may include, for example, a printed circuit board, such as a paper-based copper foil laminate, a composite copper foil laminate, or a polymer-impregnated glass-fiber-based copper foil laminate. The substrate 10 may include an organic substrate or a leadframe. The substrate 10 may include a two-layer substrate which includes a core layer and a conductive material and/or structure disposed on an upper surface and a bottom surface of the substrate. The substrate 10 may be or include an interconnection structure, such as a plurality of conductive traces and/or conductive vias. For example, the substrate 10 may include a plurality of conductive vias (e.g., conductive vias 121 and 122)

In some embodiments, the substrate 10 may be or include an interposer. In some embodiments, the substrate 10 may be or include a silicon interposer. In some embodiments, the substrate 10 includes a silicon layer 110 and a plurality of through silicon vias (TSVs) (e.g., the conductive vias 121 and 122) penetrating the silicon layer 110. In some embodiments, each of the TSVs includes a conductive layer and an insulating layer covering the conductive layer. For example, the conductive via 121 may include a conductive layer 121*a* and an insulating layer 121*b* covering the conductive layer 121*a*, and the conductive via 122 may include a conductive layer 122*a* and an insulting layer 122*b* covering the conductive layer 122*a*. The conductive layer may include a conductive material such as a metal or metal alloy. Examples include gold (Au), silver (Ag), aluminum (Al), copper (Cu), or an alloy thereof. The insulating layer may include a dielectric layer, including one or more organic materials (e.g., phosphoric anhydride (PA), polyimide (PI), polybenzoxazole (PBO), epoxy, an epoxy-based material, or the like), one or more inorganic materials (e.g., silicon, glass, ceramic, silicon oxide, silicon nitride, or the like), or any combinations thereof. The silicon layer 110 may be relatively thin. In some embodiments, a thickness of the silicon layer 110 is from about 60 μm to about 80 μm, e.g., about 70 μm.

The substrate 10 may have a surface 101 and a surface 102 opposite to the surface 101. In some embodiments, the substrate 10 has a cavity 10C. The cavity 10C may be an opening, a through hole penetrating the interposer from the surface 101 to the surface 102, or a recess exposed from at least one of the surfaces 101 and 102. The cavity 10C may be configured for accommodating one or more electronic components.

The conductive structure 123*a* may be configured for heat dissipation. In some embodiments, the conductive structure 123*a* is configured for providing heat dissipation for an electronic component (e.g., the electronic component 30) outside of the substrate 10. In some embodiments, the conductive structure 123*a* is formed of or includes a heat dissipation structure. In some embodiments, the conductive structure 123*a* is configured to provide a heat dissipation path P2. In some embodiments, the heat dissipation path P2 passes through the substrate 10 from the surface 101 to the surface 102. In some embodiments, the conductive structure 123*a* penetrates the substrate 10 extending from the surface 101 to the surface 102. In some embodiments, the conductive structure 123*a* may be electrically connected to a dummy pad of the electronic component 30 through the connection element 80 (e.g., the conductive pad) without conducting any electrical functions with the electronic component 30. In some embodiments, the conductive structure 123*a* extends along an inner sidewall 10C1 of the cavity 10C. In some embodiments, the insulting layer 123*b* covers the conductive structure 123*a*. In some embodiments, the conductive structure 123*a* is spaced apart from the inner sidewall 10C1 of the cavity 10C by the insulating layer 123*b*. In some embodiments, the insulating layer 123*b* is disposed adjacent to a lateral surface 213 of the electronic component 210 and configured to block a leakage between the electronic component 210 and the conductive structure 123*a*. The materials of the conductive structure 123*a* and the insulating layer 123*b* are similar to those mentioned above, and description thereof is omitted here. In some embodiments, the conductive structure 123*a* includes a thermal conductive material, an electrical conductive material, or a combination thereof. In some embodiments, the conductive structure 123*a* is configured to provide electrical shielding between the electronic device 20 and the conductive vias 121 and 122.

The electronic device 20 may be at least partially embedded in the substrate 10. In some embodiments, the electronic device 20 is disposed in the cavity 10C. In some embodiments, the silicon layer 110 is spaced apart from the electronic device 20 by a gap G1. In some embodiments, the inner sidewall 10C1 of the cavity 10C is spaced apart from the electronic device 20 by a gap G1. In some embodiments, the gap G1 is filled with a thermal conductive material, an electrical conductive material, or a combination thereof. In some embodiments, the gap G1 surrounds the electronic device 20. In some embodiments, the conductive structure 123*a* is filled in the gap G1. In some embodiments, the electronic device 20 is between the conductive via 121 and the conductive structure 123. In some embodiments, the conductive via 121 is spaced apart from the electronic device 20 by a gap G2. In some embodiments, the gap G2 is larger or wider than the gap G1.

In some embodiments, the electronic device 20 may be or include a package or a device package. In some embodiments, the electronic device 20 includes an electronic component 210 and a reinforcement 220 supporting the electronic component 210. In some embodiments, the reinforcement 220 includes an encapsulant (e.g., encapsulants 220' and/or 220") covering at least a portion the electronic device 20. The encapsulant may include an epoxy resin having fillers, a molding compound (e.g., an epoxy molding compound or other molding compound), polyimide, a phenolic compound or material, a material with a silicone dispersed therein, or a combination thereof. In some embodiments, the reinforcement 220 includes one or more encapsulants (e.g., the encapsulants 220' and 220") encapsulating the electronic component 210. In some embodiments, the reinforcement 220 includes two encapsulants 220' and 220" encapsulating opposite sides of the electronic device 20. The opposite sides may include a first side (or an upper surface side) and a second side opposite to the first side (or a bottom surface side) of the electronic device 20. In some embodiments, the electronic component 210 is embedded in the substrate 10. In some embodiments, the electronic component 210 is disposed in the cavity 10C. In some embodiments, the reinforcement 220 is in the cavity 10C. In some embodiments, the conductive structure 123*a* is embedded in the substrate 10 and adjacent to the electronic component 210. In some embodiments, the conductive structure 123*a* surrounds the electronic component 210. In some embodiments, the conductive structure 123*a* surrounds the electronic component 210 and the reinforcement 220 in the cavity 10C. In some embodiments, the conductive structure 123*a* extends along the lateral surface 213 of the electronic component 210 and is configured for heat dissipation. In some embodiments, the electronic component 210 may be or include a power regulating component (e.g., a PMIC), a passive component (e.g., a capacitor, an inductor, or the like), a memory component (e.g., a HBM), or a combination thereof. In some embodiments, the electronic component 210 is configured for providing regulating voltage to the electronic component 30. The electronic component 210 may be relatively thin. In some embodiments, a thickness of the electronic component 210 is from about 40 μm to about 60 μm, e.g., about 50 μm.

In some embodiments, the substrate 10 (or the silicon interposer) may have a relatively thin thickness, and thus the electronic component 210 is usually performed with a thinning operation so as to be formed embedded in the relatively thin substrate 10. While the relatively thin electronic component 210 may have insufficient rigidity to maintain its structural stability during the manufacturing process (e.g., the pick-and-place operation and etc.), the reinforcement 220 (e.g., the encapsulants 220' and 220") can provide rigidity reinforcement to the relatively thin electronic component 210. Therefore, the relatively thin electronic component 210 can have sufficient structural stability during the manufacturing process. In addition, the reinforcement 220 can be thinned in subsequent operations to expose conductive features (e.g., conductive pillars 230 and 240) connected to the electronic component 210.

In some embodiments, the electronic device 20 further includes a conductive structure disposed in the cavity 10C and configured to provide an electrical connection to the electronic component 210. In some embodiments, the reinforcement 220 (or an encapsulant 220' and/or 220" of the reinforcement 220) encapsulates the conductive structure in the cavity 10C. In some embodiments, the conductive structure 123a is around the conductive structure. In some embodiments, the conductive structure 123a surrounds the conductive structure. In some embodiments, the conductive structure includes a plurality of conductive pillars (e.g., pillars 230 and/or pillars 240). In some embodiments, the conductive pillar 230 and the conductive pillar 240 connect to opposite sides or surfaces of the electronic component 210. In some embodiments, the reinforcement 220 encapsulates the conductive pillars 230 and 240. In some embodiments, the conductive pillar 230 penetrates the reinforcement 220 and electrically connects the electronic component 210 to another electronic component (e.g., the electronic component 30) external to the electronic device 20. In some embodiments, the conductive pillar 230 penetrates the encapsulant 220' of the reinforcement 220. In some embodiments, the conductive pillar 240 penetrates the reinforcement 220 and electrically connects the electronic component 210 to one or more electrical contacts on the surface 102 of the substrate 10. In some embodiments, the conductive pillar 240 penetrates the encapsulant 220" of the reinforcement 220. In some embodiments, the conductive pillar 240 is configured to provide a path P3 to or from the electronic component 210. In some embodiments, the path P3 may be a heat dissipation path. In some embodiments, the conductive pillar 240 penetrates the reinforcement 220 and dissipates heat from the electronic component 210 to outside of the substrate 10. In some embodiments, the conductive pillar 240 may be a dummy conductive pillar. In some other embodiments, the path P3 may be an electrical path. For example, the path P3 may be a power path configured to transmit power (or a power voltage) to the electronic component 210. In some embodiments, the conductive pillar 240 is configured to supply power to the electronic component 210. In some embodiments, a thickness of the conductive pillar 230 is from about 5 µm to about 15 µm, e.g., about 10 µm. In some embodiments, a thickness of the conductive pillar 240 is from about 5 µm to about 15 µm, e.g., about 10 µm.

The electronic components 30 and 32 may be disposed over the substrate 10. In some embodiments, the electronic components 30 and 32 are disposed on the substrate 10. The electronic components 30 and 32 may be disposed over the surface 101 of the substrate 10. In some embodiments, the electronic components 30 and 32 are arranged side-by-side and spaced apart from each other by a distance. The distance may be from about 60 µm to about 80 µm, e.g., about 70 µm. In some embodiments, the conductive via 121 is configured to provide an electrical path to the electronic component 30, and the conductive via 122 is configured to provide an electrical path to the electronic component 32. In some embodiments, the electronic component 30 is electrically connected to the electronic device 20. In some embodiments, the conductive structure 123a is configured to dissipate heat from the electronic component 30. In some embodiments, the conductive structure 123a is configured to provide the heat dissipation path P2 from the electronic component 30. In some embodiments, a projection of the electronic component 210 on the surface 101 of the substrate 10 overlaps a projection of the electronic component 30 on the surface 101 of the substrate 10. In some embodiments, the conductive pillar 230 is configured to electrically connect the electronic component 210 to the electronic component 30. In some embodiments, the conductive pillar 230 penetrates the reinforcement 220 and electrically connects the electronic component 210 to the electronic component 30. In some embodiments, the electronic components 30 and 32 include processing components (e.g., ASICs, FPGAs, GPUs, or the like).

In some embodiments, the electronic component 30 has a region 310 and a region 320 distinct from the region 310. In some embodiments, the region 310 is directly above the electronic component 210. In some embodiments, the region 320 is directly above the conductive vias 121. In some embodiments, the region 320 is connected with the conductive vias 121 of the substrate 10. In some embodiments, the region 320 is electrically connected to the conductive vias 121 of the substrate 10. In some embodiments, the cavity 10C is at least partially under the region 310 and accommodating the electronic component 210.

In some embodiments, the semiconductor package structure 1 may include a connection structure configured to provide an electrical path P1 from the electronic component 210 to the region 310 of the electronic component 30 vertically (e.g., along a direction D1). In some embodiments, the direction D1 is substantially perpendicular to the surface 101 of the substrate 10. In some embodiments, the electrical path P1 may be a power path. In some embodiments, a power voltage may be supplied or transmitted through the path P3 to the electronic component 210 to be regulated, and a regulated power voltage may be transmitted from the electronic component 210 through the electrical path P1 to the electronic component 30. In some embodiments, the electrical path P1 does not pass through a redistribution structure including various conductive paths along vertical and horizontal directions. In some embodiments, the connection structure does not include a fan-out structure including a plurality of conductive layers and conductive vias extending along various different directions. In some embodiments, the connection structure includes a conductive pad, a conductive via, a conductive pillar, a solder ball, or a combination thereof. For example, the connection structure may include a conductive via 420, the connection element 82 (or the conductive pad), the conductive pillar 230, and a connection element (or a solder ball) 80. In some embodiments, the electrical path P1 is entirely between the electronic component 210 and the region 310 of the electronic component 30. In some embodiments, the connection structure configured to provide the electrical path P1 is entirely between the electronic component 210 and the region 310 of the electronic component 30.

The RDL 40 may be between the substrate 10 and the electronic component 30. In some embodiments, the RDL 40 is between the substrate 10 and the electronic component 32. In some embodiments, a distance between the RDL 40 and the electronic component 30 and/or the electronic component 32 is from about 30 µm to about 50 µm e.g., about 40 In some embodiments, a thickness of the RDL 40 is from about 5 µm to about 15 µm e.g., about 10 µm. In some embodiments, a projection of the electronic device 20 on the RDL 40 overlaps a projection of the electronic component 30 on the RDL 40. In some embodiments, the RDL 40 includes a dielectric structure 410 and one or more conductive vias 420 in the dielectric structure 410. The dielectric structure 410 may include one or more organic materials (e.g., phosphoric anhydride (PA), polyimide (PI), polybenzoxazole (PBO), epoxy, an epoxy-based material, or the like), one or more inorganic materials (e.g., silicon, glass, ceramic, silicon oxide, silicon nitride, or the like), or any combinations thereof. In some embodiments, one or more of the conductive vias 420 may be included in the connection structure for providing the electrical path P1. In some embodiments, the conductive via 420 which the electrical path P1 passes through is on the surface 101 of the substrate 10 and entirely between the electronic component 210 and the region 310 of the electronic component 30.

The connection elements 80 may electrically connect the electronic components 30 and 32 to the RDL 40. In some embodiments, the connection elements 80 and 82 electrically connect the electronic components 30 and 32 to the RDL 40. In some embodiments, the connection element 80 and 82 may be dummy pads which electrically connect to dummy pads of the electronic components 30 and 32 without conducting any electrical functions with the electronic components 30 and 32. In some embodiments, the connection structure for providing the electrical path P1 includes the connection elements 80 and 82 which are entirely between the electronic component 210 and the region 310 of the electronic component 30. In some embodiments, the connection elements 80 may be or include solder balls, and the connection elements 82 may be or include conductive pads.

The underfill 50 may be between the electronic component 30 and the RDL 40. In some embodiments, the underfill 50 covers the connection elements 80 and 82. In some embodiments, the underfill 50 covers a portion of the connection structure for providing the electrical path P1, for example, the connection elements 80 and 82.

The encapsulant 60 may encapsulate the electronic components 30 and 32. In some embodiments, the encapsulant 60 encapsulates the underfill 50. In some embodiments, a lateral side of the encapsulant 60 substantially aligns with a lateral side of the substrate 10.

The electrical contacts 70 may be disposed on the surface 102 of the substrate 10. In some embodiments, the conductive pillar 240 is configured to electrically connect the electronic component 210 to the electrical contact 70. In some embodiments, some of the electrical contacts 70 are electrically connected to the conductive vias 121 and 122 for electrical connection to the electronic components 30 and 32, respectively. In some embodiments, one or more of the electrical contacts 70 are connected to the conductive structure 123a for dissipating heat from the electronic component 30. In some embodiments, the heat dissipation path P2 passes through the connection elements 80 and 82, the conductive via 420, the conductive structure 123a, and the electrical contact 70. In some embodiments, the path P3 passes through the conductive pillar 240 and the electrical contact 70. In some embodiments, the electrical contacts 70 may include controlled collapse chip connection (C4) bumps, a ball grid array (BGA), or a land grid array (LGA).

The insulation layer 90 may be disposed on the surface 102 of the substrate 10. In some embodiments, the insulation layer 90 includes openings, and conductive vias 920 may be formed in the openings. In some embodiments, the openings of the insulation layer 90 expose portions of a bottom surface of the conductive structure 123a. In some embodiments, the conductive vias 920 are configured to dissipate heat from the electronic components 30 and 210. In some embodiments, the electrical contacts 70 are electrically connected to the conductive vias 121 and 122 and the conductive pillars 240 through the conductive vias 920 penetrating the insulation layer 90 and conductive pads 910. The path P3 may be a power path transmitting a power through the electrical contact 70, the conductive pad 910, the conductive via 920, and the conductive pillar 240 to the electronic component 210.

Figure 1B:
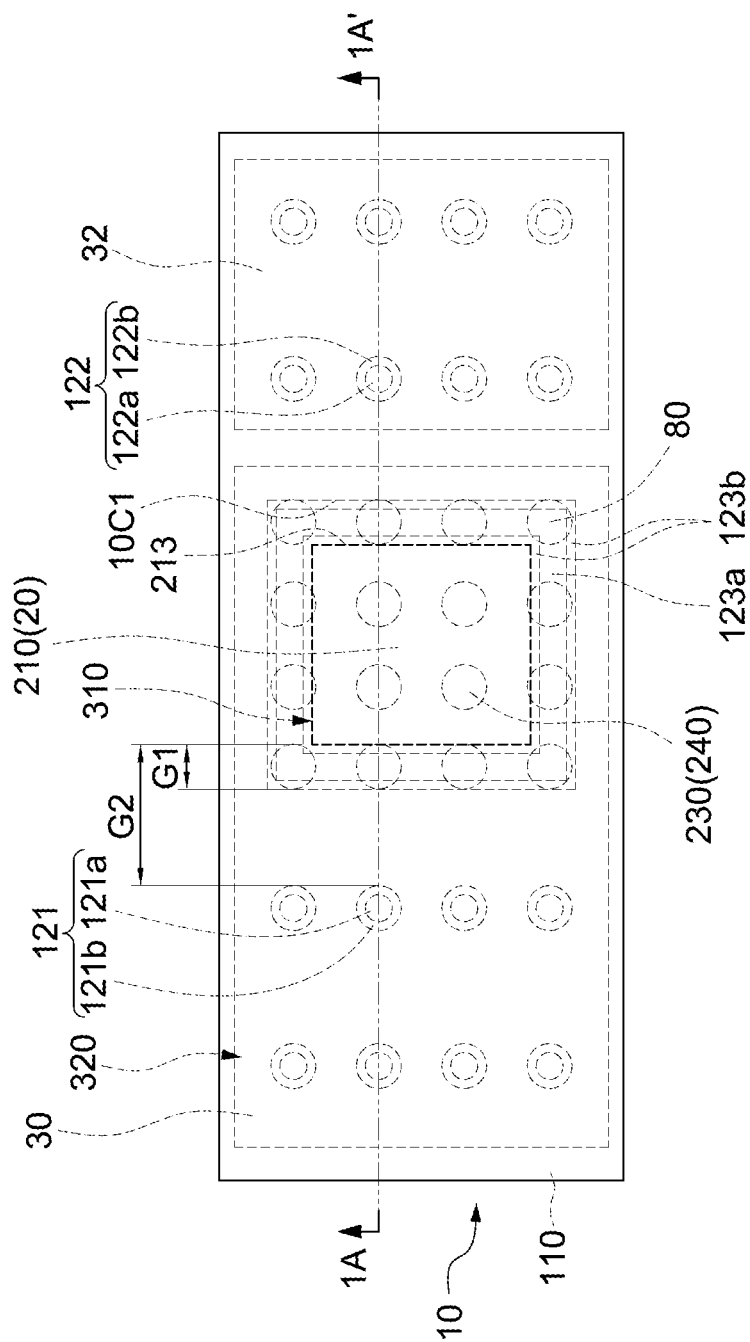
FIG. 1B illustrates a top view of a semiconductor package structure in accordance with some embodiments of the present disclosure.

FIG. 1B illustrates a top view of a semiconductor package structure in accordance with some embodiments of the present disclosure. In some embodiments, FIG. 1A illustrates a cross-sectional view along the cross-sectional line 1A-1A' in FIG. 1B. It should be noted that some components are omitted in FIG. 1B for clarity.

In some embodiments, the gap G1 surrounds the electronic component 210. In some embodiments, the gap G1 is defined by the inner sidewall 10C1 of the cavity 10C and the lateral surface 213 of the electronic component 210. In some embodiments, a projection of the conductive pillars 230 is entirely within a projection of the region 310 of the electronic component 30. In some embodiments, the conductive structure 123a is filled in the gap G1. In some embodiments, the insulating layer 123b surrounds the conductive structure 123a. In some embodiments, some of the connection elements 80 are directly above the conductive structure 123a and surround the region 310 of the electronic component 30. In some embodiments, the region 320 of the electronic component 30 is free from overlapping the electronic component 210 from a top view perspective.

Figure 1C:
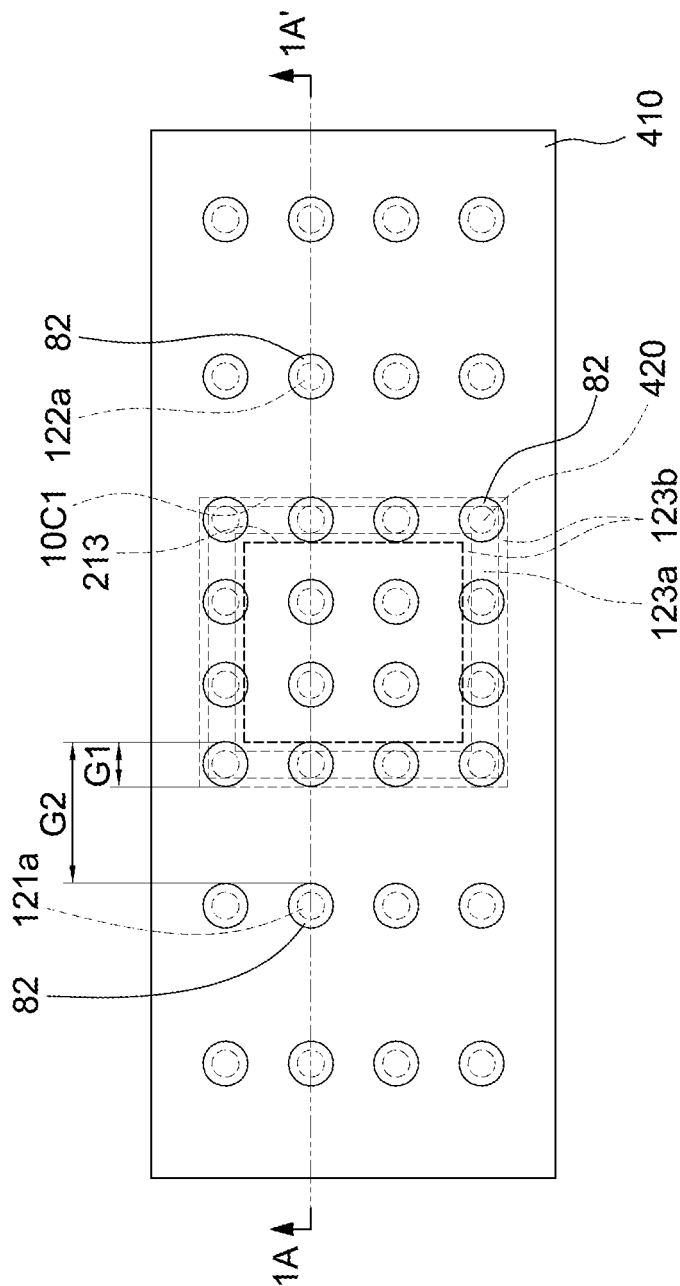
FIG. 1C illustrates a top view of a semiconductor package structure in accordance with some embodiments of the present disclosure.

FIG. 1C illustrates a top view of a semiconductor package structure in accordance with some embodiments of the present disclosure. In some embodiments, FIG. 1A illustrates a cross-sectional view along the cross-sectional line 1A-1A' in FIG. 1C. It should be noted that some components (e.g., the substrate 10, the underfill 50, the encapsulant 60, and etc.) are omitted in FIG. 1C for clarity.

In some embodiments, the dielectric structure 410 has a plurality of openings exposing portions of an upper surface of the conductive structure 123a. In some embodiments, the conductive vias 420 are disposed in the openings and connecting the conductive structure 123a to the electronic component 30. In some embodiments, each of the connection elements 82 (or the conductive pads) is connected to each of the conductive vias 420.

Figure 1D:
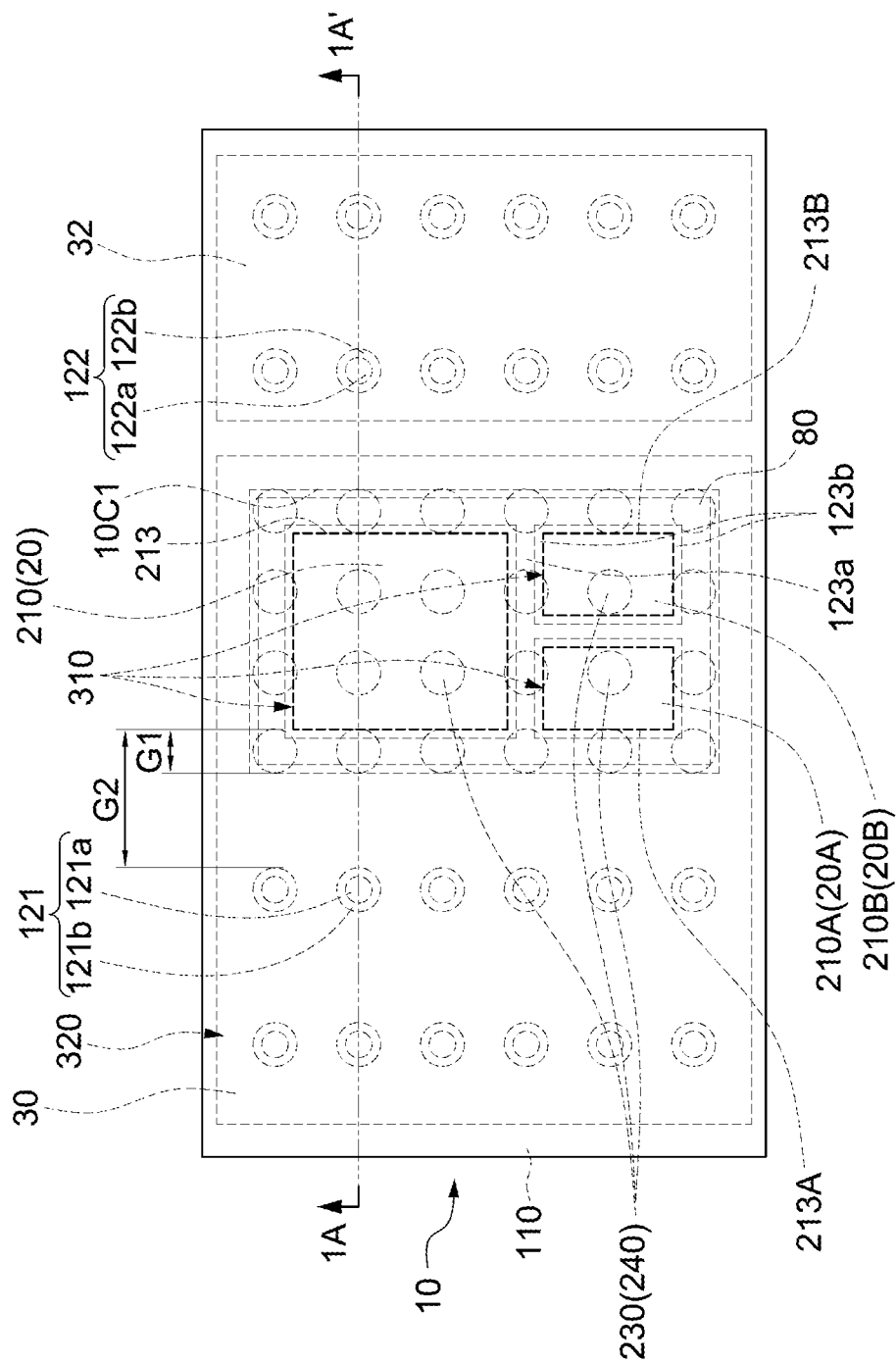
FIG. 1D illustrates a top view of a semiconductor package structure in accordance with some embodiments of the present disclosure.

FIG. 1D illustrates a top view of a semiconductor package structure in accordance with some embodiments of the present disclosure. In some embodiments, FIG. 1A illustrates a cross-sectional view along the cross-sectional line 1A-1A' in FIG. 1D. It should be noted that some components are omitted in FIG. 1D for clarity.

In some embodiments, the semiconductor package structure may further include a plurality of the device packages (e.g., device packages 20, 20A, and 20B) disposed in the cavity 10C. In some embodiments, the electronic device 20A includes an electronic component 210A, and the electronic device 20B includes an electronic component 210B. In some embodiments, the region 310 of the electronic component 30 includes three separate portions directly above the electronic component 210, the electronic component 210A, and the electronic component 210B. In some embodiments, the conductive structure 123a surrounds the electronic devices 20, 20A, and 20B. In some embodiments, the conductive structure 123a is filled in the gap G1 defined by the inner sidewall 10C1 of the cavity 10C, the lateral surface 213 of the electronic component 210, the lateral surface 213A of the electronic component 210A, and the lateral surface 213B of the electronic component 210B.

According to some embodiments of the present disclosure, the electronic device 20 including the electronic component 210 is embedded in the substrate 10 directly under the electronic component 30, and thus the transmission path between the electronic component 210 and the electronic component 30 can be reduced compared to the case wherein the electronic components 30 and 210 are arranged side-by-side. Therefore, the size of the semiconductor package structure 1 can be reduced, and the electrical performance of the semiconductor package structure 1 can be improved.

Moreover, according to some embodiments of the present disclosure, the electronic device 20 is a pre-formed package and then embedded in the substrate 10. Thus, the electronic device 20 can be disposed within the substrate 10 only after it is determined that the electronic device 20 is a known-good device package. Therefore, the manufacturing yield can be increased, and the costs resulting from rework operations due to disposing failed device packages in the semiconductor package structure can be significantly reduced.

In addition, according to some embodiments of the present disclosure, the conductive structure 123a is formed within the cavity 10C of the substrate 10 and between the electronic device 20 and the conductive vias 121 and 122. Therefore, the conductive structure 123a can function as an electrical shielding structure between the electronic device 20 and the conductive vias 121 and 122. Moreover, the conductive structure 123a penetrates the substrate 10 from the surface 101 to the surface 102, and thus it can dissipate heat from the electronic component 30 to the electrical contacts 70. Furthermore, the insulating layer 123b separates the conductive structure 123a from the silicon layer 110. Therefore, the insulating layer 123b can function as a diffusion barrier which prevents silicon atoms from diffusing towards the conductive structure 123a.

Furthermore, according to some embodiments of the present disclosure, since the cavity 10C and the vias for forming the conductive vias 121 and 122 can be formed by the same operation, the conductive structure 123a and the conductive layers 121a and 122a of the conductive vias 121 and 122 can be formed by the same operation. Therefore, the manufacturing process is simplified, and the cost is reduced. Moreover, the conductive structure 123a is formed within the gap G1 defined by the electronic device 20 and the inner sidewall 10C1 of the cavity 10C. Therefore, additional operations for forming cavities or trenches for forming a heat dissipation structure or a shielding structure can be omitted; thus, the manufacturing process is simplified, and the cost is reduced.

Figure 2:
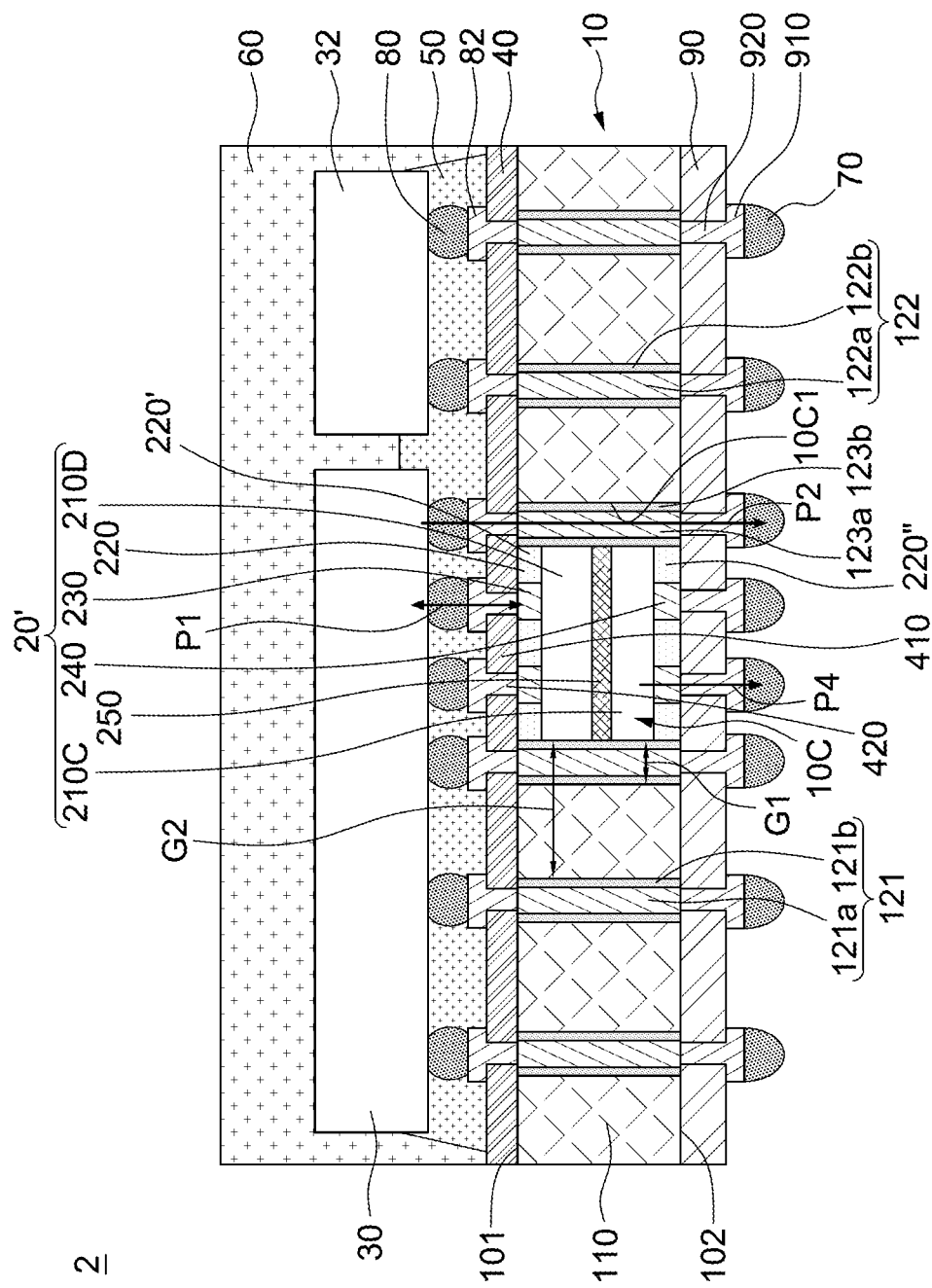
FIG. 2 illustrates a cross-sectional view of a semiconductor package structure in accordance with some embodiments of the present disclosure.

FIG. 2 illustrates a cross-sectional view of a semiconductor package structure 2 in accordance with some embodiments of the present disclosure. The semiconductor package structure 2 is similar to the semiconductor package structure 1 in FIG. 1A, and the differences therebetween are described as follows.

In some embodiments, the electronic device 20' includes an electronic component 210C, an electronic component 210D stacked on the electronic component 210C, a bonding layer 250 connecting the electronic component 210C and the electronic component 210D, and a reinforcement 220 encapsulating the electronic components 210C and 210D.

In some embodiments, the bonding layer 250 includes a hybrid bonding structure electrically connecting the electronic component 210C and the electronic component 210D.

In some embodiments, the conductive pillars 230 electrically connect to the electronic component 210C. In some embodiments, the electronic component 210C electrically connects to the electronic component 30 through the hybrid bonding structure (i.e., the bonding layer 250), the conductive pillars 230, the RDL 40, and the connection elements 80 and 82.

In some embodiments, the bonding layer 250 includes an adhesion layer electrically isolating the electronic component 210C and the electronic component 210D. In some embodiments, the adhesion layer (i.e., the bonding layer 250) adheres the electronic component 210C and the electronic component 210D without providing electrical connection therebetween. In some embodiments, the conductive pillars 230 electrically connect the electronic component 210C to the electronic component 30. In some embodiments, the conductive pillars 240 electrically connect the electronic component 210D to the electrical contacts 70. In some embodiments, the semiconductor package structure 2 may further include a connection structure (also referred to as "a second connection structure") disposed at a side of the electronic component 210 opposite to the connection structure (also referred to as "the first connection structure") configured to provide the electrical path P1. In some embodiments, the second connection structure is configured to provide an electrical path P4 from the electronic component 210D to the electrical contact 70. In some embodiments, the conductive pillar 240 is configured to provide the electrical path P4 from or to the electronic component 210D.

Figure 3A:
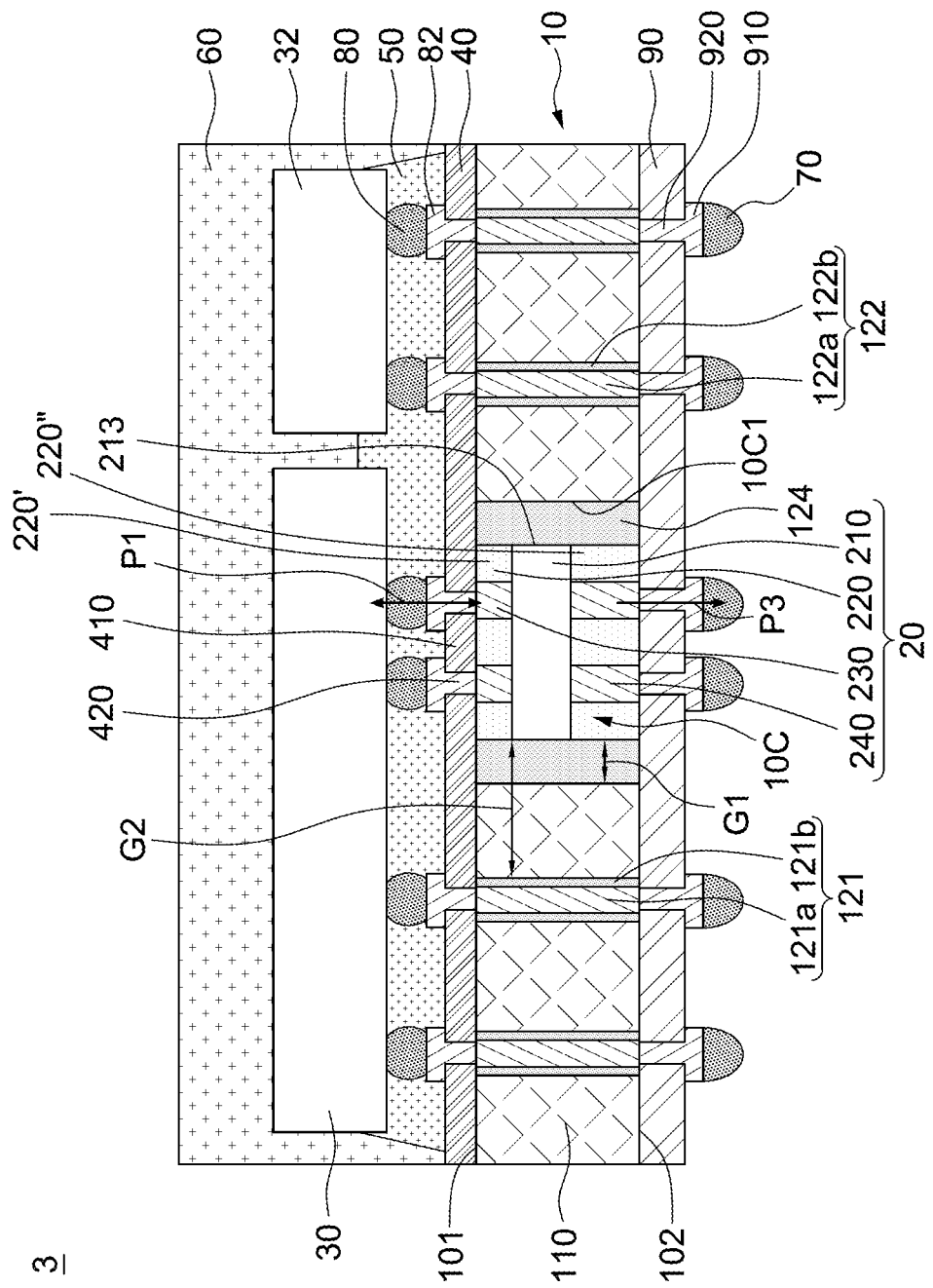
FIG. 3A illustrates a cross-sectional view of a semiconductor package structure in accordance with some embodiments of the present disclosure.

FIG. 3A illustrates a cross-sectional view of a semiconductor package structure 3 in accordance with some embodiments of the present disclosure. The semiconductor package structure 3 is similar to the semiconductor package structure 1 in FIG. 1A, and the differences therebetween are described as follows.

In some embodiments, the gap G1 is filled with a dielectric material 124. In some embodiments, the dielectric material 124 directly contacts the inner sidewall 10C1 of the cavity 10C. In some embodiments, the dielectric material 124 directly contacts the electronic component 210 and the reinforcement 220. In some embodiments, the gap G2 is filled with the dielectric material 124 and a portion of the silicon layer 110.

Figure 3B:
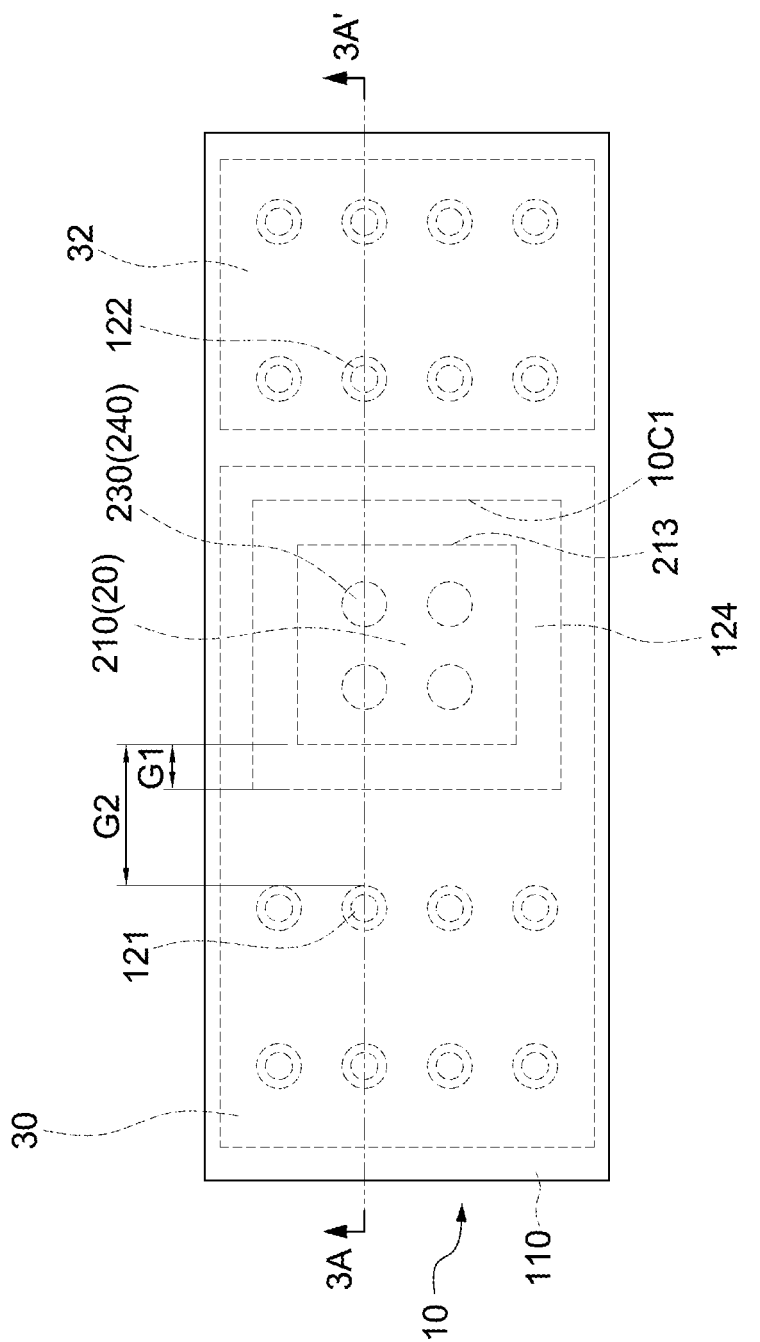
FIG. 3B illustrates a top view of a semiconductor package structure in accordance with some embodiments of the present disclosure.

FIG. 3B illustrates a top view of a semiconductor package structure in accordance with some embodiments of the present disclosure. In some embodiments, FIG. 3A illustrates a cross-sectional view along the cross-sectional line 3A-3A' in FIG. 3B. It should be noted that some components are omitted in FIG. 3B for clarity.

In some embodiments, the dielectric material 124 surrounds the electronic component 210. In some embodiments, the dielectric material 124 directly contacts the lateral surface 213 of the electronic component 210 and the inner sidewall 10C1 of the cavity 10C.

According to some embodiments of the present disclosure, the dielectric material 124 separates the electronic device 20 from the silicon layer 110. Therefore, the dielectric material 124 can function as a diffusion barrier which prevents silicon atoms from diffusing towards the electronic component 210 and the conductive pillars 230 and 240 of the electronic device 20.

Figure 4A:
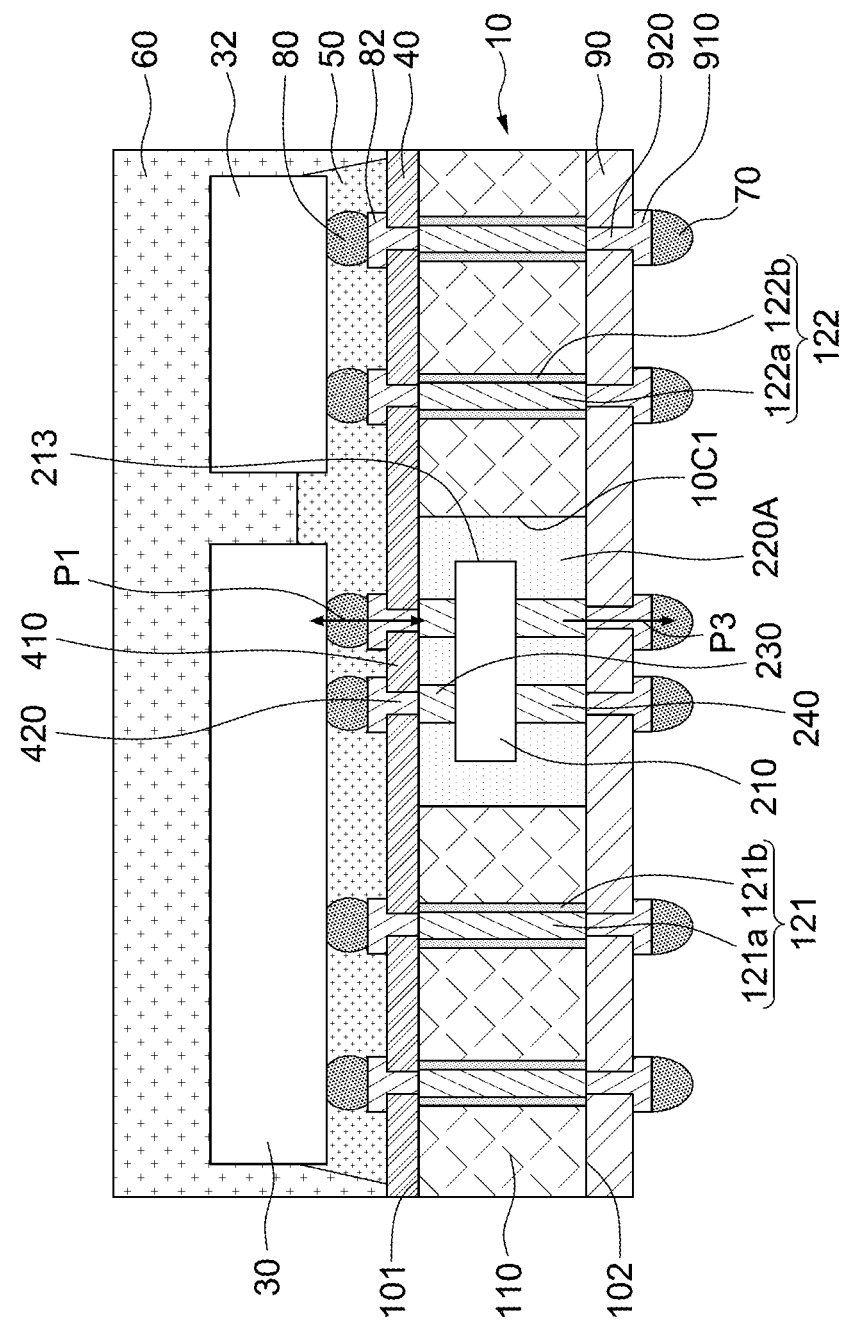
FIG. 4A illustrates a cross-sectional view of a semiconductor package structure in accordance with some embodiments of the present disclosure.

FIG. 4A illustrates a cross-sectional view of a semiconductor package structure 4 in accordance with some embodiments of the present disclosure. The semiconductor package structure 4 is similar to the semiconductor package structure 1 in FIG. 1A, and the differences therebetween are described as follows.

In some embodiments, the electronic component 210 with the conductive pillars 230 and 240 disposed or formed on its opposite surfaces is disposed in the cavity 10C, and an encapsulant 220A is filled in the cavity 10C and encapsulates the electronic component 210 and the conductive pillars 230 and 240. In some embodiments, the lateral surface 213 of the electronic component 210 is spaced apart from the inner sidewall 10C1 of the cavity 10C by the encapsulant 220A. In some embodiments, the encapsulant 220A directly contacts the lateral surface 213 of the electronic component 210.

Figure 4B:
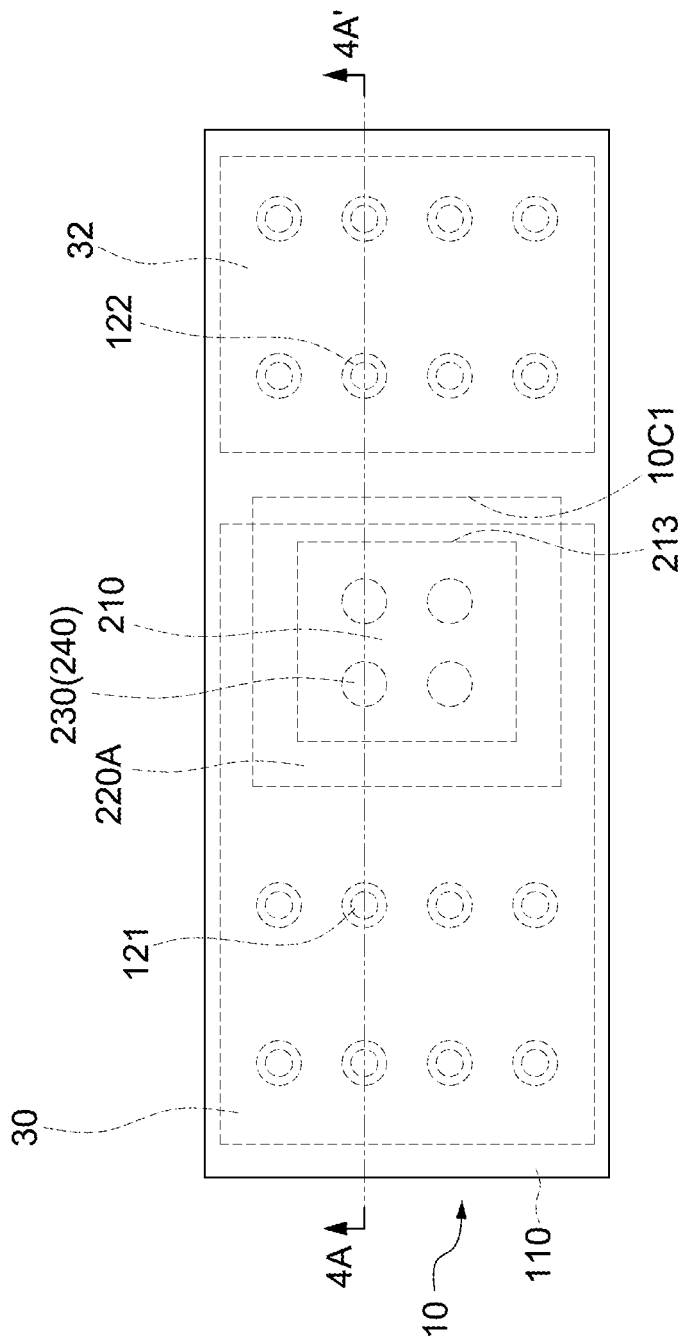
FIG. 4B illustrates a top view of a semiconductor package structure in accordance with some embodiments of the present disclosure.

FIG. 4B illustrates a top view of a semiconductor package structure in accordance with some embodiments of the present disclosure. In some embodiments, FIG. 4A illustrates a cross-sectional view along the cross-sectional line 4A-4A' in FIG. 4B. It should be noted that some components are omitted in FIG. 4B for clarity.

In some embodiments, the encapsulant 220A surrounds the electronic component 210. In some embodiments, the encapsulant 220A directly contacts the lateral surface 213 of the electronic component 210 and the inner sidewall 10C1 of the cavity 10C. In some embodiments, a portion of the encapsulant 220A is exposed from the electronic component 30 from a top view perspective.

Figure 5:
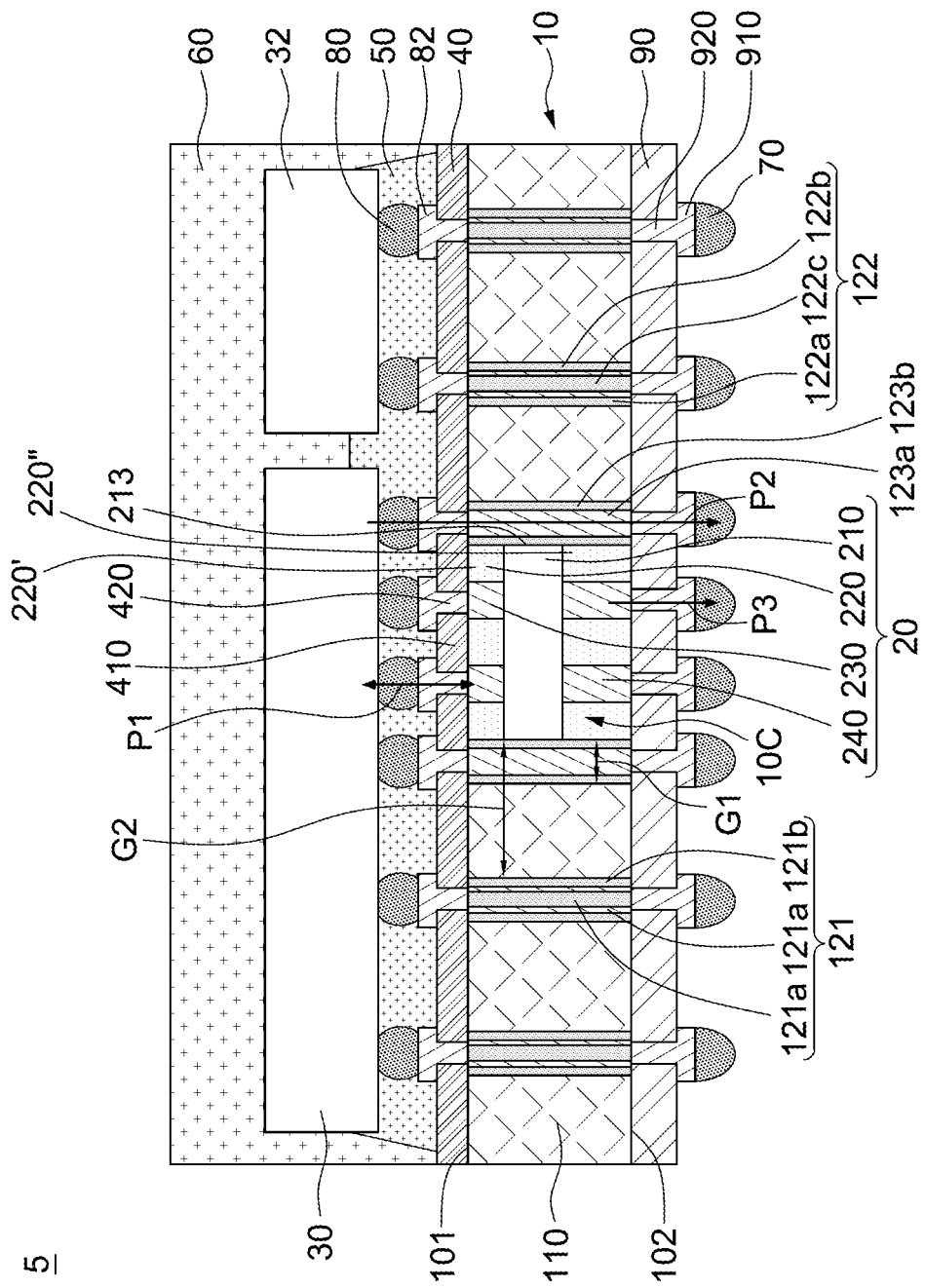
FIG. 5 illustrates a cross-sectional view of a semiconductor package structure in accordance with some embodiments of the present disclosure.

FIG. 5 illustrates a cross-sectional view of a semiconductor package structure 5 in accordance with some embodiments of the present disclosure. The semiconductor package structure 5 is similar to the semiconductor package structure 1 in FIG. 1A, and the differences therebetween are described as follows.

In some embodiments, the conductive via 121 of the semiconductor package structure 5 includes an insulating layer 121b formed on the sidewall of a through via within the substrate 10, an insulating layer 121c filled in the through via, and a conductive layer 121a between the insulating layer 121b and the insulating layer 121c. In some embodiments, the conductive layer 121a electrically connects the electronic component 30 and the electrical contact 70. In some embodiments, the conductive via 122 of the semiconductor package structure 5 includes an insulating layer 122b formed on the sidewall of a through via within the substrate 10, an insulating layer 122c filled in the through via, and a conductive layer 122a between the insulating layer 122b and the insulating layer 122c. In some embodiments, the conductive layer 121a electrically connects the electronic component 32 and the electrical contact 70.

Figure 6A:
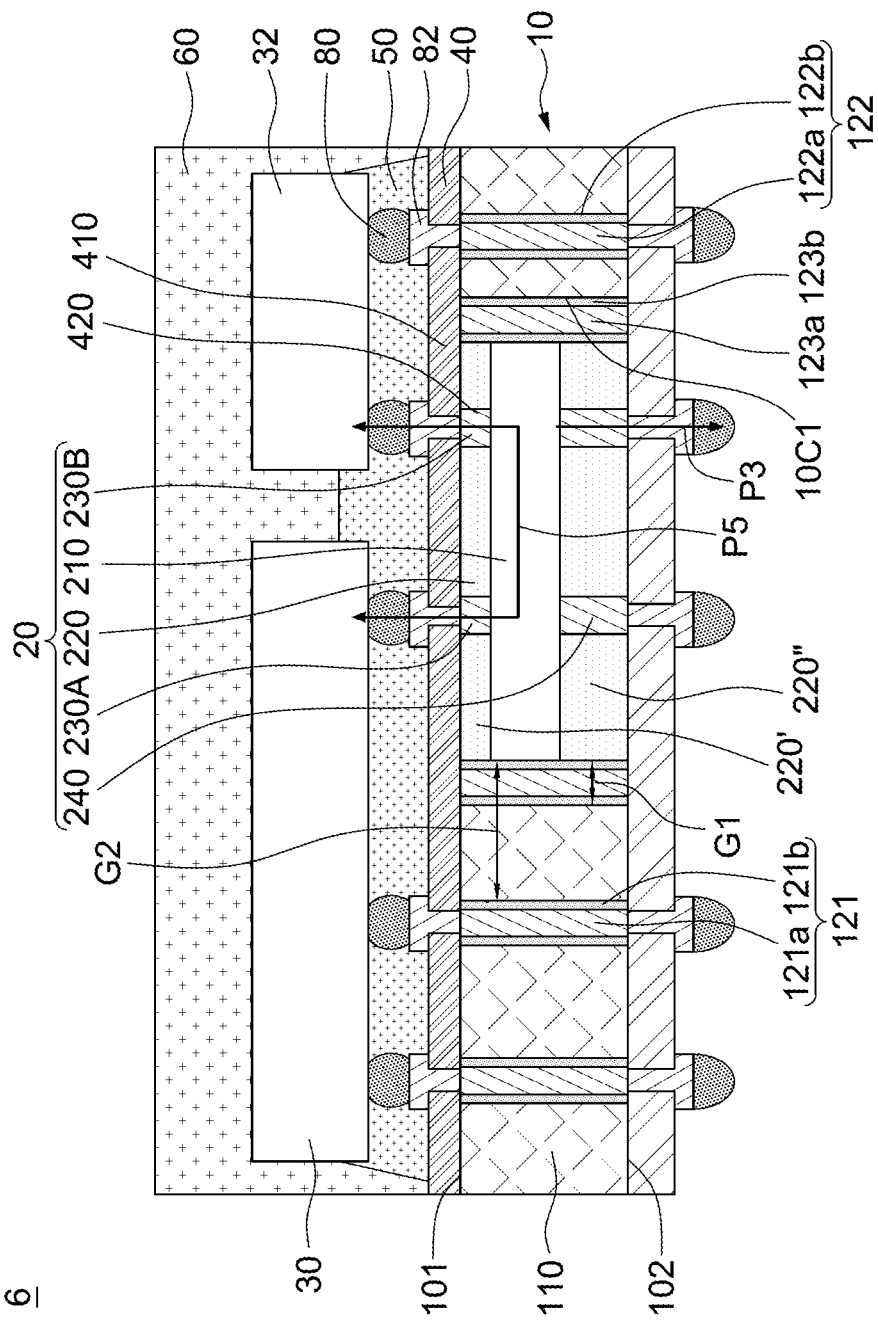
FIG. 6A illustrates a cross-sectional view of a semiconductor package structure in accordance with some embodiments of the present disclosure.

FIG. 6A illustrates a cross-sectional view of a semiconductor package structure 6 in accordance with some embodiments of the present disclosure. The semiconductor package structure 6 is similar to the semiconductor package structure 1 in FIG. 1A, and the differences therebetween are described as follows.

In some embodiments, the electronic component 32 is electrically connected to the electronic component 30 through the electronic device 20. In some embodiments, the electronic device 20 includes conductive pillars 230A and 230B that are configured to provide an electrical connection between the electronic component 30 and the electronic component 32. In some embodiments, the conductive pillars 230A and 230B are between the electronic component 210 and the electronic component 30. In some embodiments, an electrical path P5 between the electronic component 30 and the electronic component 32 passes through the conductive pillar 230A, the electronic component 210, and the conductive pillar 230B. In some embodiments the electrical path P5 further passes through the connection elements 80 and 82 and the conductive vias 420. In some embodiments, the electronic component 210 includes a bridging element.

In some embodiments, a projection of the electronic component 210 on the surface 101 of the substrate 10 overlaps a projection of the electronic component 30 on the surface 101 of the substrate 10 and a projection of the electronic component 32 on the surface 101 of the substrate 10.

Figure 6B:
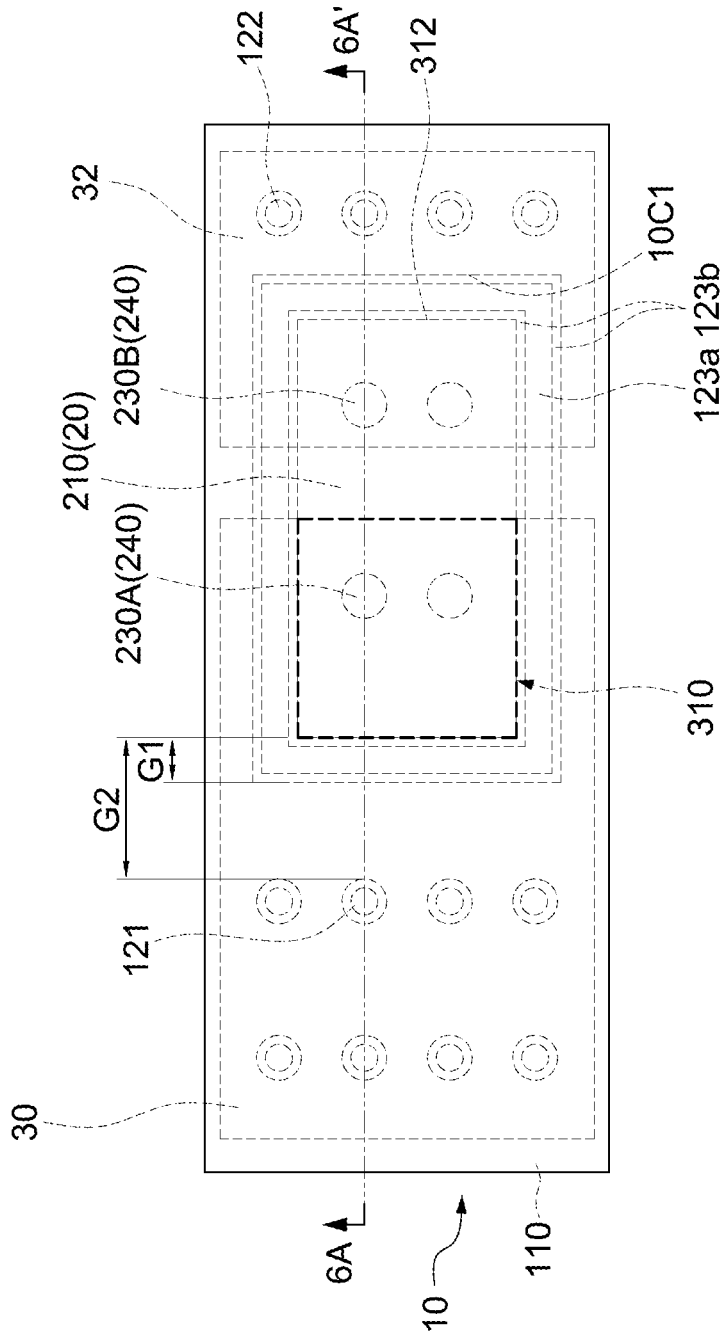
FIG. 6B illustrates a top view of a semiconductor package structure in accordance with some embodiments of the present disclosure.

FIG. 6B illustrates a top view of a semiconductor package structure in accordance with some embodiments of the present disclosure. In some embodiments, FIG. 6A illustrates a cross-sectional view along the cross-sectional line 6A-6A' in FIG. 6B. It should be noted that some components are omitted in FIG. 6B for clarity.

In some embodiments, the electronic component 210 partially overlaps the electronic component 30 and partially overlaps the electronic component 32 from a top view perspective. In some embodiments, a portion of the electronic component 210 is exposed from a gap or a space between the electronic component 30 and the electronic component 32.

FIG. 7A, FIG. 7B, FIG. 7C, FIG. 7D, FIG. 7E, FIG. 7F, FIG. 7G, FIG. 7H, and FIG. 7I illustrate various operations in a method of manufacturing a semiconductor package structure 1 in accordance with some embodiments of the present disclosure.

Figure 7A:
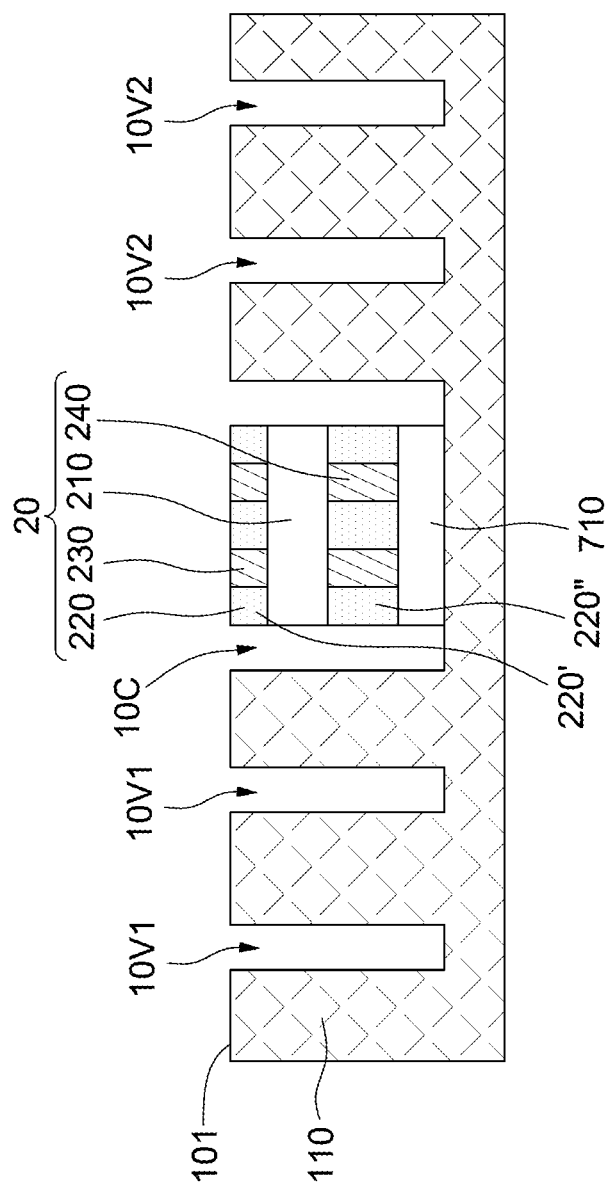
FIG. 7A, FIG. 7B, FIG. 7C, FIG. 7D, FIG. 7E, FIG. 7F, FIG. 7G, FIG. 7H, and FIG. 7I illustrate various operations in a method of manufacturing a semiconductor package structure in accordance with some embodiments of the present disclosure.

Referring to FIG. 7A, a silicon layer 110 may be provided, a cavity 10C and a plurality of vias 10V1 and 10V2 may be formed in the silicon layer 110, and an electronic device 20 may be disposed in the cavity 10C. In some embodiments, the vias 10V1 and 10V2 and the cavity 10C are exposed from a surface 101 (also referred to as "a top surface") of the silicon layer 110. In some embodiments, the electronic device 20 is adhered to a bottom of the cavity 10C through an adhesive layer 710. In some embodiments, the vias 10V1 and 10V2 and the cavity 10C are formed by the same operation, for example, a drilling operation. A lateral surface of the electronic component 210 may be exposed to the cavity 10C. The electronic component 210 may include one or more semiconductor materials, e.g., Si. In some embodiments, the electronic device 20 is formed by forming conductive pillars 230 and 240 on opposite surfaces of an electronic component 210, and then the electronic component 210 and the conductive pillars 230 and 240 are encapsulated by a reinforcement 220. In some embodiments, an inspection operation may be performed on the electronic device 20 to determine whether the electronic device 20 is a well-functioning package, and then the electronic device 20 is disposed in the cavity 10C after it is determined that the electronic device 20 is a known-good device package. In some embodiments, the silicon layer 110 may be a wafer level silicon layer and has a plurality of cavities 10C (not shown in drawings), and a plurality of device packages 20 are disposed in the plurality of cavities 10C.

In some embodiments, the reinforcement 220 (e.g., the encapsulants 220' and 220") can provide rigidity reinforcement to the relatively thin electronic component 210. Therefore, the relatively thin electronic component 210 can have sufficient structural stability during the manufacturing process, and the reinforcement 220 can be thinned in subsequent operations to expose the conductive pillars 230 and 240.

Figure 7B:
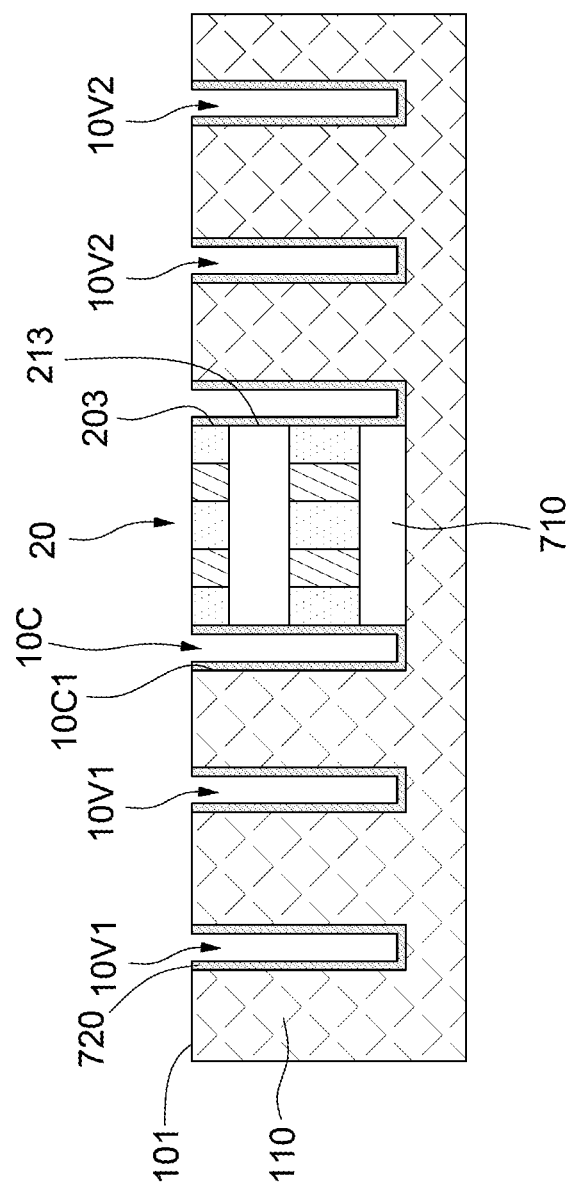

Referring to FIG. 7B, an insulating material 720 may be formed on inner sidewalls of the vias 10V1 and 10V2 and an inner sidewall 10C1 of the cavity 10C. In some embodiments, the insulating material 720 is formed on a lateral surface 203 of the electronic device 20. In some embodiments, the insulating material 720 is formed on a lateral surface 213 of the electronic component 210 and a lateral surface of the reinforcement 220. In some embodiments, the insulating material 720 may be formed by deposition. In some embodiments, the insulating material 720 is formed to cover the exposed lateral surface of the electronic component 210 which may include one or more semiconductor materials, e.g., Si. Therefore, the insulating material 720 can prevent leakage between the semiconductor material of the electronic component 210 and the conductive feature which will be filled in the cavity 10C and may be configured for shielding and thermal dissipation.

Figure 7C:
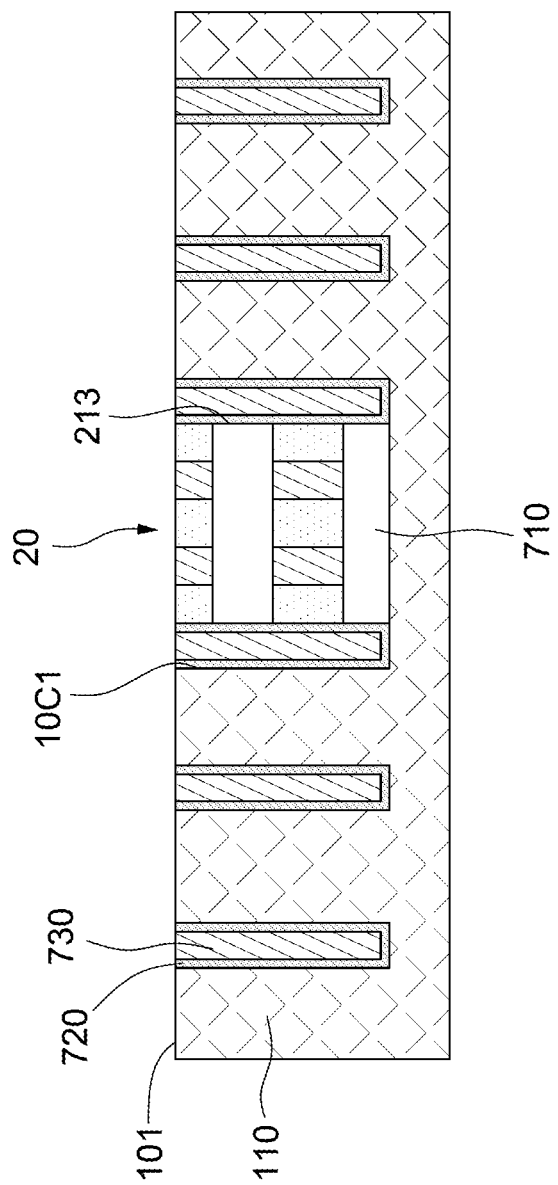

Referring to FIG. 7C, a conductive material 730 may be filled in the vias 10V1 and 10V2 and the cavity 10C. In some embodiments, the conductive material 730 is formed on the insulating material 720 in the vias 10V1 and 10V2 and the cavity 10C. In some embodiments, the conductive material 730 may be formed by plating. In some embodiments, the conductive material 730 may include Au, Ag, Al, Cu, or an alloy thereof.

Figure 7D:
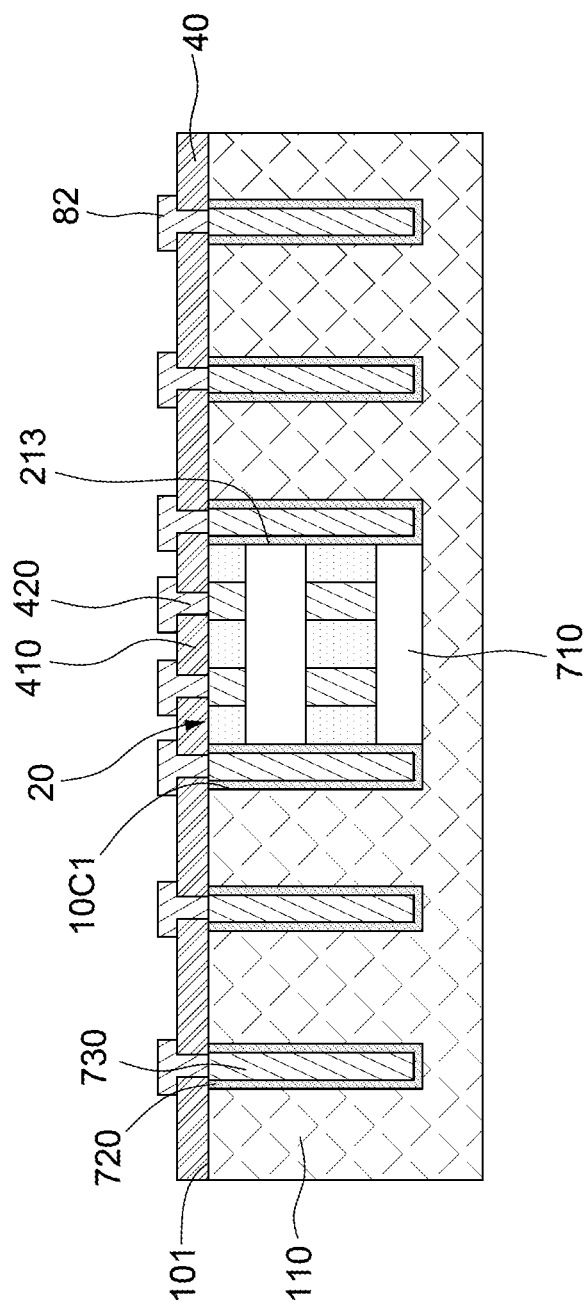

Referring to FIG. 7D, an RDL 40 may be formed on the surface 101 of the silicon layer 110, and connection elements 82 may be formed on the RDL 40. In some embodiments, a planarization operation may be performed on the surface 101 of the silicon layer 110 prior to forming the RDL 40, and the RDL 40 is formed on the planarized surface 101. The planarization operation may be performed by grinding. In some embodiments, the RDL 40 includes a dielectric structure 410 on the surface 101 of the silicon layer 110 and one or more conductive vias 420 contacting the conductive material 730. The dielectric structure 410 may include one or more organic materials (e.g., phosphoric anhydride (PA), polyimide (PI), polybenzoxazole (PBO), epoxy, an epoxy-based material, or the like), one or more inorganic materials (e.g., silicon, glass, ceramic, silicon oxide, silicon nitride, or the like), or any combinations thereof. In some embodiments, connection elements 82 (e.g., conductive pads) are further formed on the conductive vias 420 of the RDL 40. In some embodiments, the connection element 82 and the conductive via 420 are formed by the same operation, e.g., by the deposition and patterning operation.

Figure 7E:
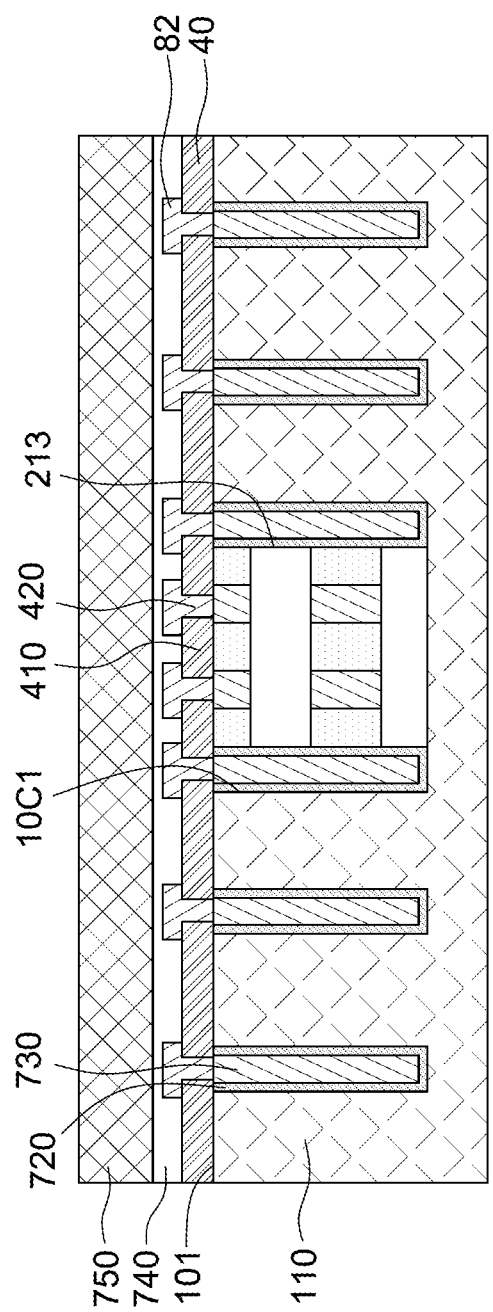

Referring to FIG. 7E, a passivation layer 740 may be formed to cover the connection elements 82, and a carrier 750 may be bonded to the passivation layer 740. The passivation layer 740 may include a dielectric material, e.g., silicon nitride, to provide a planar surface for bonding the carrier 750.

Figure 7F:
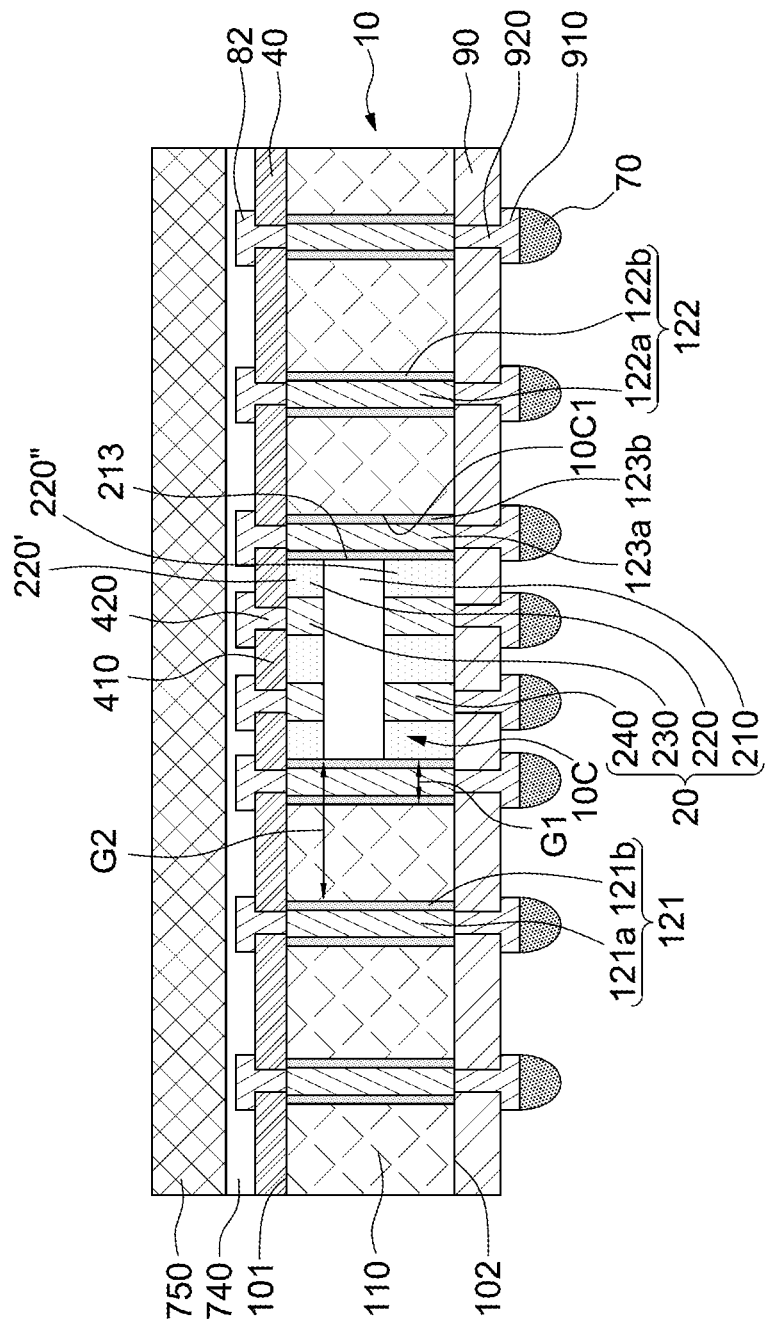

Referring to FIG. 7F, a portion of the silicon layer 110, a portion of the insulating material 720, a portion of the conductive material 730, and the adhesive layer 710 may be removed to form a substantially planar surface 102, and conductive vias 121 and 122 may be formed that are exposed from the surface 102. In some embodiments, the adhesive layer 710 is removed to expose the conductive pillars 240 and the reinforcement 220. The aforesaid removal operation may be performed by grinding. Next, an insulation layer 90 having openings or through holes may be formed on the surface 102, conductive vias 920 may be formed in the openings and penetrating the insulation layer 90, conductive pads 910 may be formed on the conductive vias 920, and electrical contacts 70 may be formed on the conductive pads 910 and the insulation layer 90. In some embodiments, the electrical contacts 70 are electrically connected to the conductive vias 121 and 122 and the conductive pillars 240 through the conductive vias 920. Thus, a substrate 10 including the conductive vias 121 and 122 and the cavity 10C for accommodating the electronic device 20 is formed.

In some embodiments, the substrate 10 may be a wafer level interposer having a plurality of cavities 10C for accommodating a plurality of device packages 20.

Figure 7G:
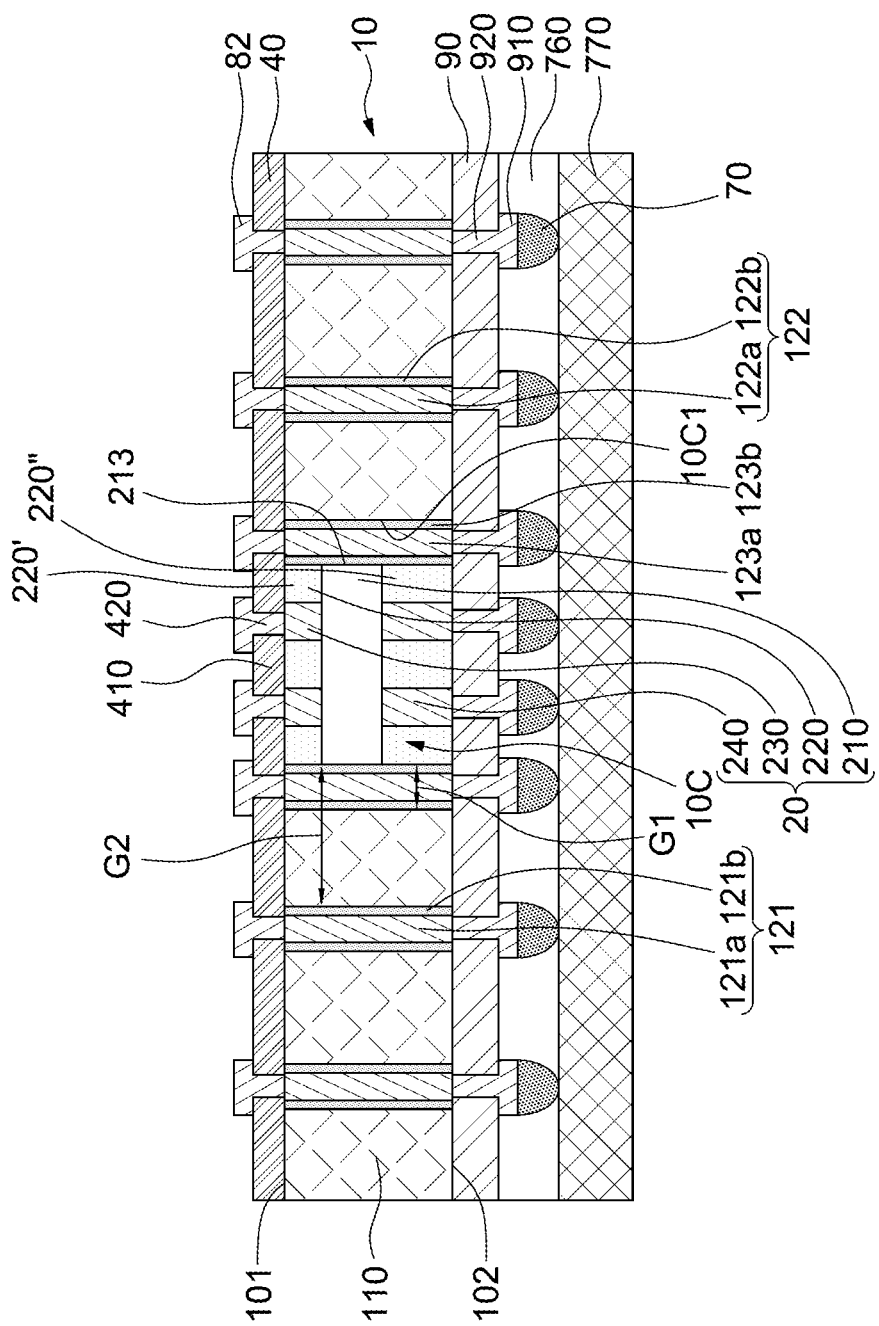

Referring to FIG. 7G, the passivation layer 740 and the carrier 750 may be removed, a passivation layer 760 may be formed to cover the electrical contacts 70, and a carrier 770 may be bonded to the passivation layer 760. The passivation layer 760 may include a dielectric material, e.g., silicon nitride, to provide a planar surface for bonding the carrier 770.

Figure 7H:
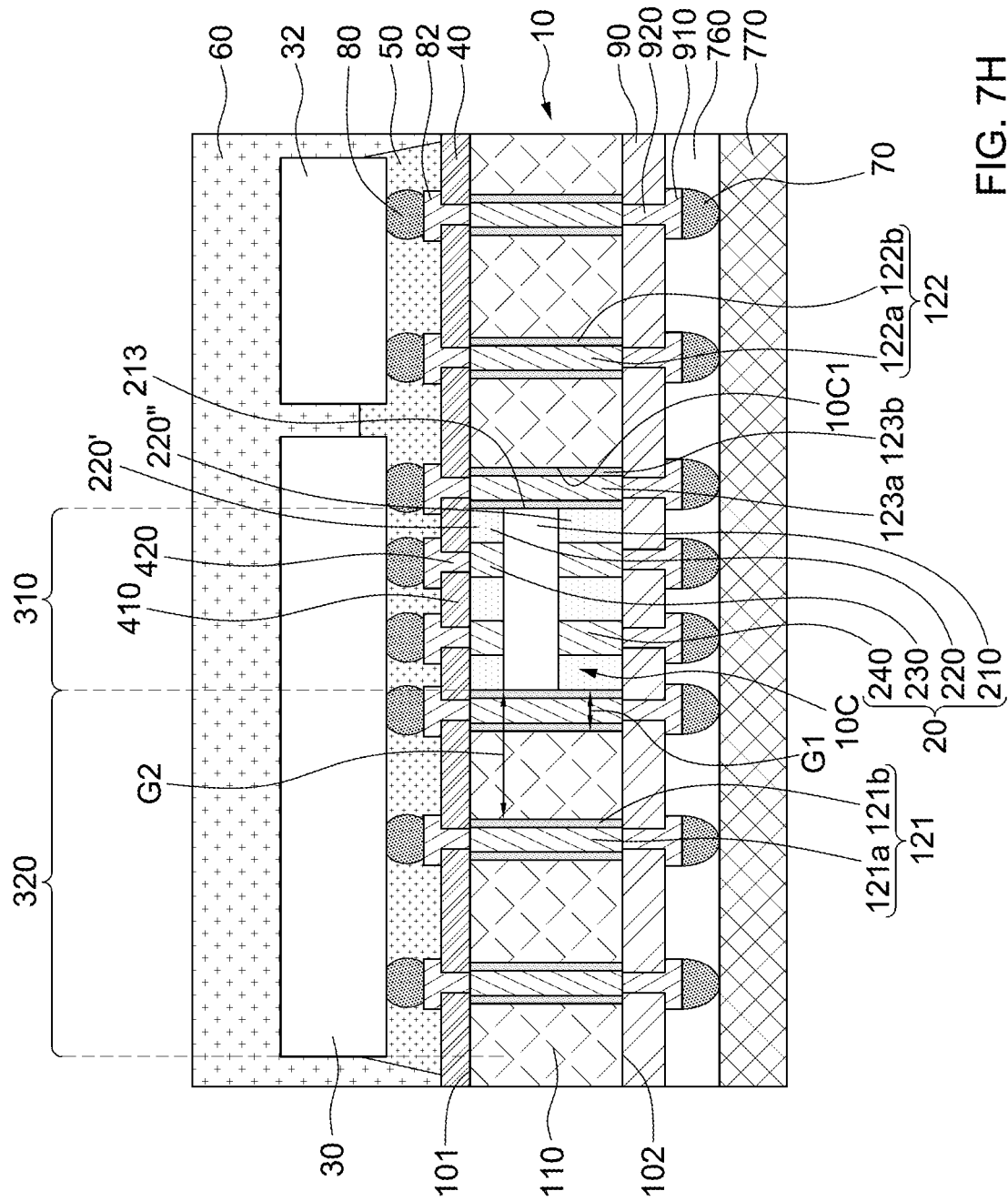

Referring to FIG. 7H, electronic components 30 and 32 may be connected to the substrate 10 through connection elements 80 (e.g., solder balls), an underfill 50 may be formed to cover the connection elements 80, and an encapsulant 60 may be formed to encapsulate the electronic components 30 and 32 and the underfill 50. In some embodiments, the electronic components 30 and 32 are flip-chip bonded to the electronic device 20 through the connection elements 80 and 82 and the RDL 40.

Figure 7I:
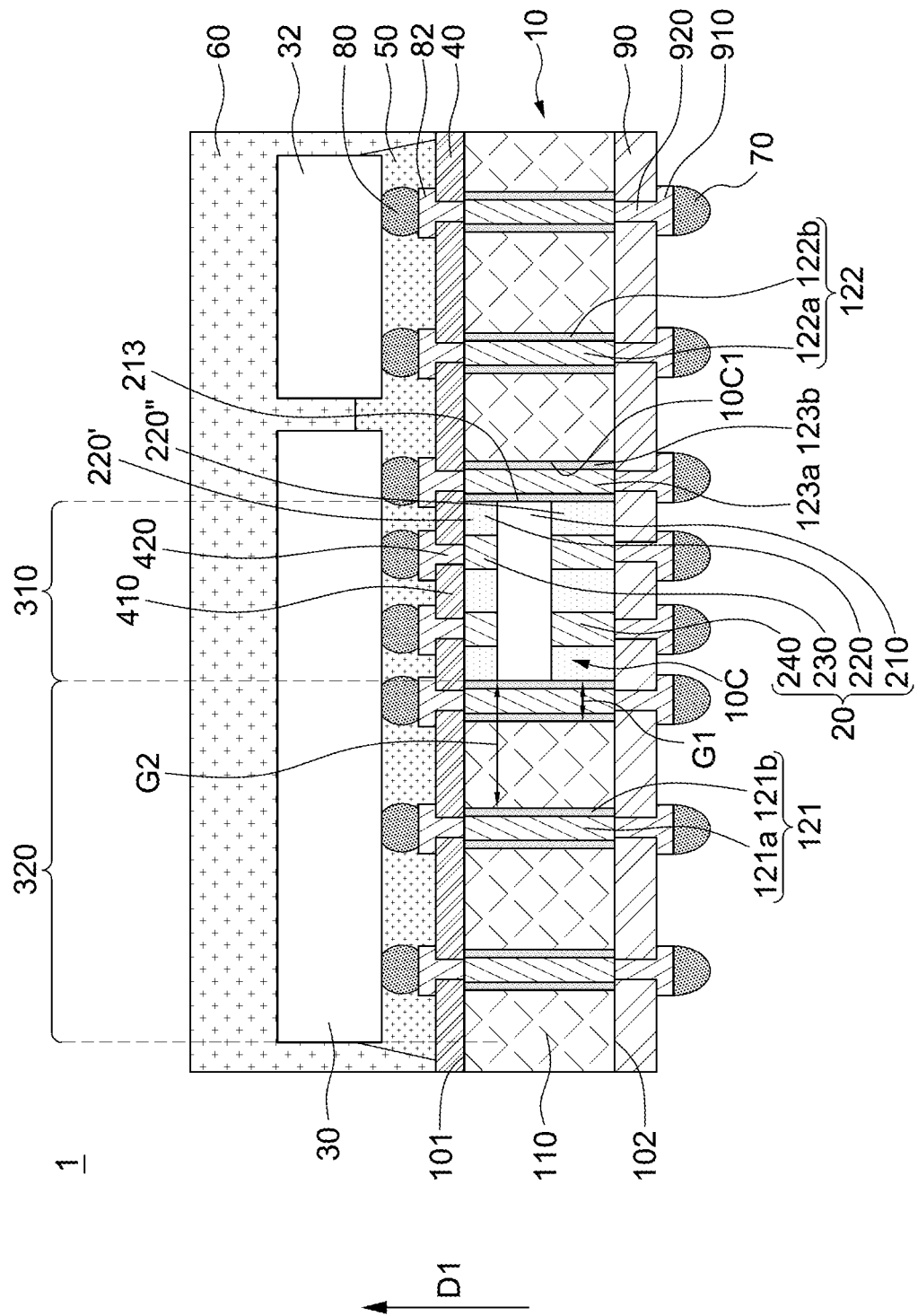

Referring to FIG. 7I, the passivation layer 740 and the carrier 750 may be removed. In some embodiments, a singulation operation may be performed on the wafer level interposer 110 having a plurality of cavities 10C for accommodating a plurality of device packages 20 to form the semiconductor device packages 1.

According to some embodiments of the present disclosure, the cavity 10C and the vias 10V1 and 10V2 can be formed by the same operation. Thus, the operation for forming the cavity 10C which serves to accommodate the embedded electronic device 20 can be combined with the operation for forming the vias 10V1 and 10V2 which serve to form conductive vias 121 and 122. Therefore, the manufacturing process is simplified, and the cost is reduced.

In addition, according to some embodiments of the present disclosure, the conductive structure 123a and the conductive layers 121a and 122a of the conductive vias 121 and 122 can be formed by the same operation. Therefore, the manufacturing process is simplified, and the cost is reduced. Moreover, the conductive structure 123a is formed within the gap G1 defined by the electronic device 20 and the inner sidewall 10C1 of the cavity 10C. Therefore, additional operations for forming cavities or trenches for forming a heat dissipation structure or a shielding structure can be omitted; thus, the manufacturing process is simplified, and the cost is reduced.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of said numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" or "about" the same if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" parallel can refer to a range of angular variation relative to 0° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°. For example, "substantially" perpendicular can refer to a range of angular variation relative to 90° that is less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately 104 S/m, such as at least 105 S/m or at least 106 S/m. The electrical conductivity of a material can sometimes vary with temperature. Unless otherwise specified, the electrical conductivity of a material is measured at room temperature.

As used herein, the singular terms "a," "an," and "the" may include plural referents unless the context clearly dictates otherwise. In the description of some embodiments, a component provided "on" or "over" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It can be clearly understood by those skilled in the art that various changes may be made, and equivalent components may be substituted within the embodiments without departing from the true spirit and scope of the present disclosure as defined by the appended claims. The illustrations may not necessarily be drawn to scale. There may be distinctions between the artistic renditions in the present disclosure and the actual apparatus, due to variables in manufacturing processes and the like. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it can be understood that these operations may be combined, sub-divided, or re-ordered to form an equivalent method without departing from the teachings of the present disclosure. Therefore, unless specifically indicated herein, the order and grouping of the operations are not limitations of the present disclosure.

What is claimed is:

1. A semiconductor package structure, comprising:
   a substrate comprising a silicon layer;
   a first electronic component disposed over the substrate; and
   an electronic device at least partially embedded in the silicon layer and comprising:
   a second electronic component configured for providing a regulated voltage to the first electronic component; and
   a reinforcement supporting the second electronic component,
   wherein the silicon layer has a through hole penetrating the silicon layer from a top surface to a bottom surface of the silicon layer, and the electronic device is in the through hole of the silicon layer.

2. The semiconductor package structure as claimed in claim 1, wherein the substrate further comprises a through silicon via (TSV) penetrating the silicon layer from the top surface to the bottom surface of the silicon layer and disposed at a lateral side of the electronic device.

3. The semiconductor package structure as claimed in claim 1, wherein the reinforcement comprises;
   a first encapsulant covering a first side of the electronic device and free from extending between the second electronic component and the silicon layer; and
   a second encapsulant covering a second side of the electronic device and free from extending between the second electronic component and the silicon layer, the second side being opposite to the first side.

4. The semiconductor package structure as claimed in claim 3, wherein the electronic device further comprises a first conductive pillar encapsulated by the first encapsulant and a second conductive pillar encapsulated by the second encapsulant, and the first encapsulant is spaced apart from the second encapsulant by the electronic device.

5. The semiconductor package structure as claimed in claim 3, wherein the electronic device further comprises a first conductive pillar penetrating the first encapsulant and electrically connecting the second electronic component to the first electronic component, and a top surface of the first conductive pillar substantially aligns with the top surface of the silicon layer.

6. The semiconductor package structure as claimed in claim 1, further comprising a through silicon via (TSV) penetrating the silicon layer from the top surface to the bottom surface of the silicon layer and electrically connected to the first electronic component.

7. The semiconductor package structure as claimed in claim 6, further comprising a conductive via over the electrically connected to the TSV, wherein a width of the conductive via is less than a width of the TSV.

8. The semiconductor package structure as claimed in claim 1, further comprising a heat dissipating via extending along an inner sidewall of the through hole, wherein a height of the heat dissipating via is substantially the same as a depth of the through hole.

9. The semiconductor package structure as claimed in claim 8, further comprising an insulating layer surrounding the heat dissipating via and contacting the inner sidewall of the through hole.

10. The semiconductor package structure as claimed in claim 1, further comprising an insulation layer contacting the bottom surface of the silicon layer and exposed to the through hole.

11. The semiconductor package structure as claimed in claim 10, further comprising:
    a conductive pad within the insulation layer; and
    a conductive pillar encapsulated by the reinforcement and electrically connecting the conductive pad to the second electronic component.

12. The semiconductor package structure as claimed in claim 1, further comprising a first conductive pillar in the through hole and connected to a top surface of the electronic device.

13. The semiconductor package structure as claimed in claim 12, further comprising a redistribution layer (RDL) on the top surface of the silicon layer and electrically connecting the first conductive pillar to the first electronic component.

14. The semiconductor package structure as claimed in claim 1, wherein the electronic device further comprises a third electronic component stacked on the second electronic component, and the reinforcement comprises an encapsulant structure encapsulating the second electronic component and the third electronic component.

15. The semiconductor package structure as claimed in claim 14, wherein the reinforcement comprises a first encapsulant encapsulating a top surface of the third electronic component and a second encapsulant encapsulating a bottom surface of the second electronic component.

16. The semiconductor package structure as claimed in claim 14, further comprising an adhesion layer between and electrically isolating the second electronic component and the third electronic component.

17. The semiconductor package structure as claimed in claim 14, further comprising a conductive structure in the through hole and surrounding the second electronic component and the third electronic component.

18. The semiconductor package structure as claimed in claim 17, wherein the substrate further comprises a plurality of conductive vias penetrating the silicon layer from the top surface to the bottom surface of the silicon layer, and a top surface of the conductive structure substantially aligns with top surfaces of the conductive vias.

19. The semiconductor package structure as claimed in claim 18, wherein a bottom surface of the conductive structure substantially aligns with bottom surfaces of the conductive vias.

20. The semiconductor package structure as claimed in claim 17, further comprising a bonding layer connecting the second electronic component to the third electronic component, wherein the conductive structure surrounds the bonding layer.

* * * * *